United States Patent
Kato et al.

(10) Patent No.: US 7,239,548 B2
(45) Date of Patent: Jul. 3, 2007

(54) METHOD AND APPARATUS FOR APPLYING BIAS TO A STORAGE DEVICE

(75) Inventors: Kenta Kato, Aichi-ken (JP); Takaaki Furuyama, Kasugai (JP)

(73) Assignee: Spansion LLC, Sunnyvale, CA (US)

( * ) Notice: Subject to any disclaimer, the term of this patent is extended or adjusted under 35 U.S.C. 154(b) by 28 days.

(21) Appl. No.: 11/317,082

(22) Filed: Dec. 21, 2005

(65) Prior Publication Data

US 2006/0227630 A1   Oct. 12, 2006

Related U.S. Application Data

(63) Continuation of application No. PCT/JP2004/019329, filed on Dec. 24, 2004.

(51) Int. Cl.
*G11C 16/06* (2006.01)
*G11C 16/04* (2006.01)

(52) U.S. Cl. .......................... 365/185.09; 365/185.11; 365/200; 365/226; 365/227

(58) Field of Classification Search .......... 365/185.09
See application file for complete search history.

(56) References Cited

U.S. PATENT DOCUMENTS

| | | | |
|---|---|---|---|
| 5,689,463 A | 11/1997 | Murakami et al. | |
| 5,774,396 A * | 6/1998 | Lee et al. ............... | 365/185.09 |
| 6,072,719 A | 6/2000 | Tanzawa et al. | |
| 6,154,403 A | 11/2000 | Tanzawa et al. | |
| 6,249,479 B1 | 6/2001 | Tanzawa et al. | |
| 6,262,926 B1 | 7/2001 | Nakai | |
| 6,349,061 B1 | 2/2002 | Yoneyama et al. | |
| 6,504,771 B2 * | 1/2003 | Shionoya ................ | 365/200 |
| 6,567,305 B2 * | 5/2003 | Nakamura .............. | 365/185.11 |
| 6,625,071 B2 * | 9/2003 | Ikeda et al. ............. | 365/200 |
| 6,639,853 B2 * | 10/2003 | Kuiri ...................... | 365/200 |
| 2005/0286337 A1 * | 12/2005 | Louie et al. ............ | 365/232 |

FOREIGN PATENT DOCUMENTS

| | | |
|---|---|---|
| JP | 59-185100 | 10/1984 |
| JP | 01-251397 | 10/1989 |
| JP | 03-225851 | 10/1991 |
| JP | 04-155692 | 5/1992 |

(Continued)

*Primary Examiner*—Son L. Mai
(74) *Attorney, Agent, or Firm*—Ingrassia Fisher & Lorenz, P.C.

(57) ABSTRACT

In Step 1, a bias is applied (ON) to all of vertical rows $Z1(0)$ to $Z1(2)$. With respect to the horizontal rows, a bias is not applied (OFF) to a horizontal row $Z2(0)$ where the defective sector exists and a bias is applied (ON) to the other horizontal rows $Z2(1)$ and $Z2(2)$. On the sectors in the horizontal rows $Z2(1)$ and $Z2(2)$, a voltage stress is applied and an access operation is performed. In Step 2, with respect to the vertical rows, a bias is not applied (OFF) to a vertical row $Z1(1)$ where the defective sector exists and a bias is applied (ON) to the other vertical rows $Z1(0)$ and $Z1(2)$. With respect to the horizontal rows, a bias is applied (ON) to the horizontal row $Z2(0)$ where the defective sector exists, and no bias is applied (OFF) to the other horizontal rows $Z2(1)$ and $Z2(2)$. As for the two steps, a voltage stress can be applied once to the sectors other than the defective sector.

16 Claims, 18 Drawing Sheets

FOREIGN PATENT DOCUMENTS

| | | |
|---|---|---|
| JP | 05-226613 | 9/1993 |
| JP | 05-243386 | 9/1993 |
| JP | 06-196656 | 7/1994 |
| JP | 08-102529 | 4/1996 |
| JP | 08-106796 | 4/1996 |
| JP | 08-227597 | 9/1996 |
| JP | 09-288899 | 11/1997 |
| JP | 2000-040395 | 2/2000 |
| JP | 2000-137991 | 5/2000 |
| JP | 2001-084800 | 3/2001 |
| JP | 2001-101899 | 4/2001 |
| JP | 2004-253021 | 9/2004 |

* cited by examiner

FIG. 20

| MODE | SECTOR | Z1 | Z2 | VPXH | VPXV | RNEGP | NEN | XDS | GWL | GWLB | VWL | P2WL | WELL | [STRESS] |
|---|---|---|---|---|---|---|---|---|---|---|---|---|---|---|
| ER STRESS (FIRST) | S06(NORMAL) | VCC | VCC | 0 | 0 | -9 | 0 | -9 | -9 | 0 | 0 | -9 | 9 | APPLIED |
|  | S07(DEFECTIVE) | VCC | 0 | 0 | 0 | 0 | 0 | 0 | 0 | 0 | 0 | Float | 9 | NOT APPLIED |
|  | S17(NORMAL) | VCC | 0 | 0 | 0 | 0 | 0 | 0 | 0 | 0 | 0 | Float | 9 | NOT APPLIED |
| ER STRESS (SECOND) | S06(NORMAL) | 0 | 0 | 0 | 0 | 0 | -9 | 0 | 0 | 0 | 0 | Float | 0 | NOT APPLIED |
|  | S07(DEFECTIVE) | 0 | VCC | 0 | 0 | -9 | -9 | 0 | -9 | 0 | 0 | Float | 0 | NOT APPLIED |
|  | S17(NORMAL) | VCC | VCC | 0 | 0 | -9 | 0 | -9 | 9 | 0 | 0 | -9 | 9 | APPLIED |
| PGM STRESS (FIRST) | S06(NORMAL) | VCC | VCC | 9 | 9 | 0 | VCC | 0 | 9 | 0 | 9 | 9 | 0 | APPLIED |
|  | S07(DEFECTIVE) | VCC | 0 | 0 | 9 | 0 | VCC | 0 | 0 | VCC | 9 | 0 | 0 | NOT APPLIED |
|  | S17(NORMAL) | VCC | 0 | 0 | 9 | 0 | VCC | 0 | 0 | VCC | 9 | 0 | 0 | NOT APPLIED |
| PGM STRESS (SECOND) | S06(NORMAL) | 0 | 0 | 9 | 0 | 0 | VCC | 0 | 0 | VCC | 0 | 0 | 0 | NOT APPLIED |
|  | S07(DEFECTIVE) | 0 | VCC | 9 | 0 | 0 | VCC | 0 | 9 | 0 | 0 | 0 | 0 | NOT APPLIED |
|  | S17(NORMAL) | VCC | VCC | 9 | 9 | 0 | VCC | 0 | 9 | 0 | 9 | 9 | 0 | APPLIED |

FIG. 21

| MODE | SECTOR | Z1 | Z2 | VPXH | VPXV | RNEGP | NEN | XDS | GWL | GWLB | VWL | P2WL | WELL | [STRESS] |
|---|---|---|---|---|---|---|---|---|---|---|---|---|---|---|
| HTRB | S06(NORMAL) | VCC | VCC | P | P | 0 | VCC | 0 | P | 0 | P | P | 0 | MEASURED |
| LEAK MEASUREMENT (FIRST) | S07(DEFECTIVE) | VCC | 0 | 0 | P | 0 | VCC | 0 | 0 | VCC | P | 0 | 0 | NOT MEASURED |
| | S17(NORMAL) | VCC | 0 | 0 | P | 0 | VCC | 0 | 0 | VCC | P | 0 | 0 | NOT MEASURED |
| HTRB | S06(NORMAL) | 0 | 0 | P | 0 | 0 | VCC | 0 | 0 | VCC | 0 | 0 | 0 | NOT MEASURED |
| LEAK MEASUREMENT (SECOND) | S07(DEFECTIVE) | 0 | VCC | P | P | 0 | VCC | 0 | P | 0 | 0 | 0 | 0 | NOT MEASURED |
| | S17(NORMAL) | VCC | VCC | 0 | P | 0 | VCC | 0 | P | 0 | P | P | 0 | MEASURED |
| Fast Chip ER | S06(NORMAL) | VCC | VCC | 0 | 0 | −9 | 0 | −9 | −9 | 0 | 0 | −9 | 9 | APPLIED |
| | S07(DEFECTIVE) | VCC | 0 | 0 | 0 | 0 | 0 | 0 | 0 | 0 | 0 | Float | 9 | NOT APPLIED |
| | S17(NORMAL) | 0 | 0 | 0 | 0 | 0 | −9 | 0 | 0 | 0 | 0 | Float | 0 | NOT APPLIED |

(P:INDICATES VOLTAGE CONNECTED TO PAD)

METHOD AND APPARATUS FOR APPLYING BIAS TO A STORAGE DEVICE

CROSS-REFERENCES TO RELATED APPLICATIONS

This is a continuation of International Application No. PCT/JP2004/019329, filed Dec. 24, 2004 which was not published in English under PCT Article 21(2).

TECHNICAL FIELD

The present invention relates to semiconductor storage devices having a plurality of: memory cells. More particularly, the invention relates to a method and apparatus for applying a bias to a storage device simultaneous with applying a bias to a plurality of sectors in a group.

BACKGROUND

Japanese Unexamined Patent Publication No. 2001-137991 (hereinafter referred to as "Patent Document 1") discloses a nonvolatile semiconductor memory having sectors in a plurality of areas and capable of erasing stored data in a group. The nonvolatile semiconductor memory has a high voltage generating circuit for generating high voltages to be used for erasing data and a plurality of transistors connected between the high voltage generating circuit and the sectors in the plurality of areas. At the time of erasing a group of data together, a plurality of transistors are operated with a constant current to control the current passed to the sectors in the plurality of areas. Consequently, even if a defective sector exists in the sectors, current to be passed is regulated to a constant value so that high voltage necessary for erasure can be maintained and batch erase can be performed.

In a semiconductor storage device as disclosed in Japanese Unexamined Patent Publication No. H8-106796 (hereinafter referred to as "Patent Document 2"), a "select" signal is always output to blocks which are not switched to redundant blocks by switching means among a plurality of blocks, and a "non-select" signal is output to a defective block switched to a redundant block in response to an input signal of batch writing/batch erasing all blocks in a test mode. The semiconductor storage device has a block selecting circuit for inhibiting application of a batch write/erase voltage to a defective block in a block batch write/erase mode. With this configuration, high voltage is not applied to a defective block and a voltage value does not drop due to current leakage.

SUMMARY OF THE INVENTION

Problems to Be Solved by the Invention

In Patent Document 1, a transistor connects a sector and the high voltage generating circuit and performs a constant current operation at the time of batch erase. In Patent Document 2, the block selecting circuit inhibits application of voltage to a defective block during the batch write/erase mode. In Patent Document 1, current flowing in the case where a defective sector exists is also regulated to a constant value. In Patent Document 2, application of a voltage to a defective block is inhibited and a bias voltage is prevented from being dropped by excessive current.

However, in Patent Document 1, current regulation has to be performed sector by sector and a transistor for current regulation has to be provided sector by sector. In Patent Document 2, voltage application control has to be performed block by block, and the block selection circuit for voltage application control has to be provided block by block.

Consequently, a voltage control unit such as the transistor for current regulation or the block selection circuit for voltage application control has to be disposed in a memory cell array area in which sectors or blocks are arranged in a matrix. It may disturb efficient layout of a memory cell array in a general memory cell array area which has a configuration and design rule different from the device configuration for a control circuit as a component of the voltage control unit and in which memory cells are disposed optimally. This is a problem as it may increase the chip size.

It is expected that the number of sectors and blocks will increase as capacity increases in the future and, accordingly, the number of voltage control units such as the transistor for current regulation and the block selecting circuit for voltage application control will increase. The problem is magnified since the area occupied by the voltage control units enlarges with the increase in the number of sectors and blocks, thereby greatly increasing the chip size.

Means for Solving the Problem

The present invention has been achieved in consideration of the problems of the background art and an object of the present invention is to provide a bias applying method for a storage device, and a storage device, including voltage control units provided for rows in first and second directions, in which a voltage bias: is applied to a memory block in accordance with a combination of voltages applied to the rows in both directions. By controlling the application of a bias to each of the rows in the first and second directions while avoiding application of a bias to a defective memory block, batch bias application to a plurality of memory blocks can be efficiently performed.

A storage device in accordance with the present invention attempting to achieve the object stated above is provided with a plurality of memory blocks, wherein the memory blocks are fundamental units to be accessed and disposed in at least one of a first direction and a second direction, the first direction and the second direction intersecting with each other for disposition, the storage device comprising a first voltage control section coupled to respective first rows aligned along the first direction to control an application of bias voltage to the respective first rows, and a second voltage control section coupled to respective second rows aligned along the second direction to control an application of bias voltage to the respective second rows, wherein at least two of the plurality of memory blocks, excluding any defective memory blocks, which are disposed at a cross-section between the respective first rows and the respective second rows are simultaneously accessed.

In the storage device in accordance with the present invention, according to the direction in which memory blocks in a memory block group are disposed, the first voltage control section executes control of the application of a voltage bias to each of the rows lined along the first direction, and the second voltage control section executes Control of application of a voltage bias to each of the rows lined along the second direction. By combining the application controls for the rows in the first and second directions, a voltage bias is applied to a memory block disposed at the intersecting position.

Consequently, it is sufficient to provide the first or second voltage control section for each of the rows in which memory blocks of a memory block group are disposed, and it is unnecessary to provide the voltage control section for each of the memory blocks. It is sufficient to dispose the first and second voltage control sections in the periphery of the memory cell array area, and memory cells can be disposed concentrated in the memory cell array area. With a configuration different from the device configuration for a control circuit as a component of the voltage control section and a design rule, the memory cell array area can be designed efficiently. Also, in the case where the number of memory blocks increases, the number of voltage control sections required can be reduced. Therefore, an increase in the chip area can be controlled.

Furthermore, the method of applying bias to a storage device in accordance with the present invention which attempts to achieve the object stated above includes a plurality of memory blocks that are fundamental units to be accessed and disposed in least one of a first direction and a second direction intersecting with each other for disposition, the method comprising the steps of applying bias voltage to the plurality of memory blocks by controlling an application of the bias voltage to respective first rows aligned along the first direction and respective second rows aligned along the second direction, and when defective memory blocks exist among the plurality of memory blocks, not applying the bias voltage to certain rows corresponding to certain locations where the defective memory blocks exist among the respective rows lined along one of the first and second directions.

In the bias voltage application method of a storage device in accordance with the present invention, a voltage bias application control is performed on respective rows along the first and second directions in accordance with the direction in which memory blocks of a memory block group are arranged. As applying a voltage bias to memory blocks is in accordance with the combination of rows between the first and second directions, no voltage bias is applied to the row in either the first or second direction in which a defective memory block exists.

Consequently, at the time of applying a voltage bias simultaneously to a plurality of memory blocks by controlling application of the voltage bias to each of the rows along the first and second directions, by not to applying a voltage bias to the row in either the first or second direction in which a defective memory block exists, no voltage bias can be applied. In such a manner, the voltage bias can be applied simultaneously to the memory blocks of the memory block group other than the defective memory block or memory blocks existing in the row which includes the defective memory block and on which no application control is performed. A voltage stress can be applied at least once to each of the memory blocks, other than the defective memory block, in two steps, and the access operation can be completed by a small number of steps.

Effects of the Invention

The present invention can provide a bias applying method for a storage device, and a storage device for operation in accordance therewith, including voltage control sections provided for rows in first and second directions, in which a voltage bias is applied to a memory block in accordance with a combination of voltages applied to the rows in both directions. By controlling application of a bias to each of the rows in the first and second directions, while avoiding application of a bias to a defective memory block, batch bias application to a plurality of memory blocks can be efficiently performed.

BRIEF DESCRIPTION OF THE DRAWINGS

FIG. 20 is a diagram showing voltage bias states of signals during each access operation (1) (erasing operation and programming operation) in accordance with the present invention;

FIG. 21 is a diagram showing voltage bias states of signals during each access operation (2) (HTRB leak test and first chip erase operation) in accordance with the present invention.

DETAILED DESCRIPTION OF THE INVENTION

An embodiment of a bias applying method of a storage device and a storage device in accordance with the present invention will be described in detail hereinbelow with reference to FIGS. 1 to 22.

Figure 1:
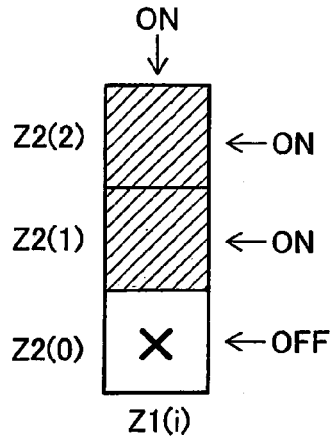
FIG. 1 is a schematic diagram showing a first bias applying method in accordance with the present invention.
Figure 2:
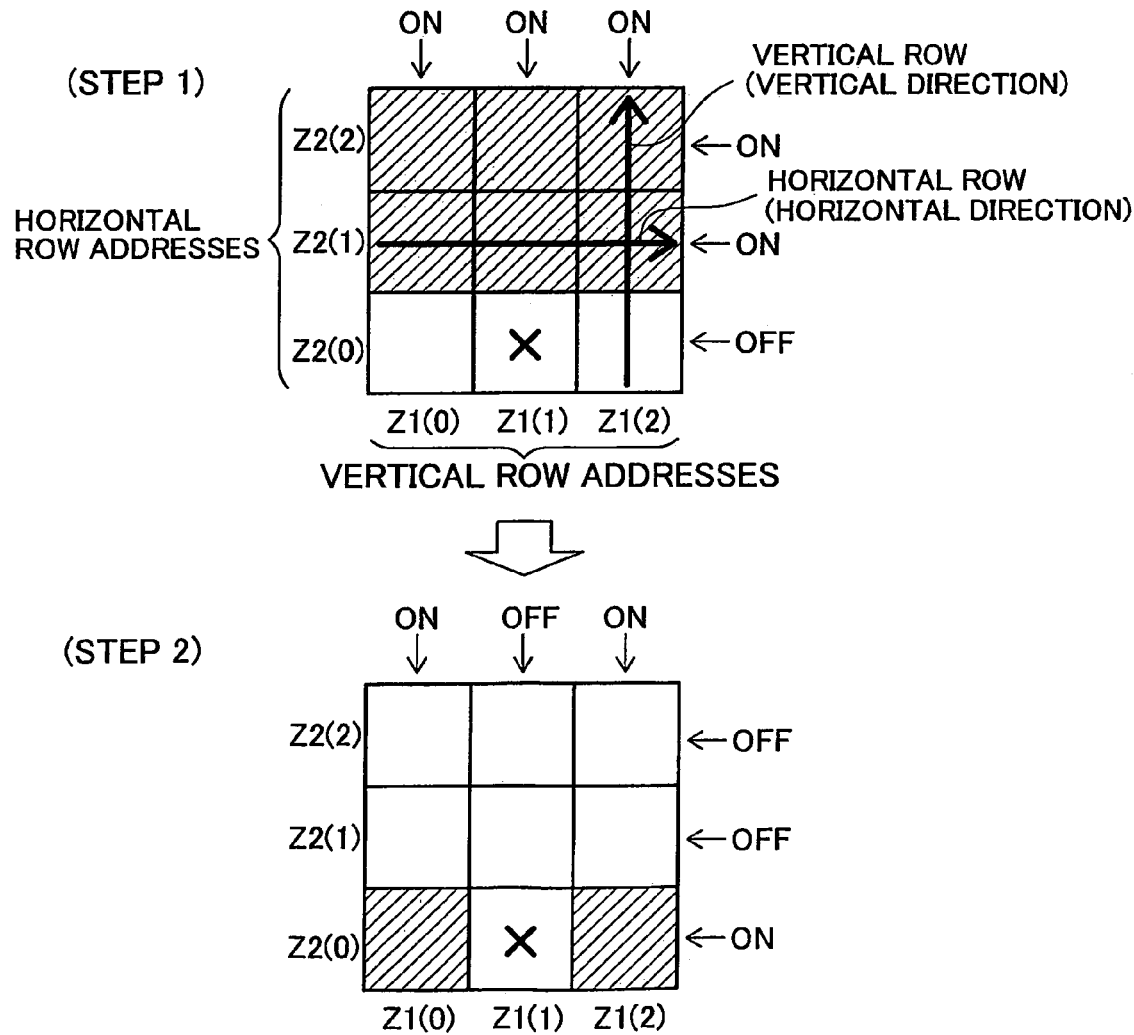
FIG. 2 is a schematic diagram showing a second bias applying method in accordance with the present invention.

FIGS. 1 and 2 schematically show the bias applying method in accordance with the present invention. The present invention provides a bias applying method for a storage device having a plurality of sectors each of which is a basic unit of access and is constructed by a plurality of memory cells. In the storage device, a voltage bias is applied to a plurality of sectors to be accessed on a row unit basis and a voltage stress can be applied to all of the sectors other than a defective sector by a minimum step.

For example, when the storage device is a nonvolatile storage device, an erasing operation is an example of access, and the sector is a basic unit of the erasing operation. Access is made not only during the erasing operation but also during a programming operation and a stress test operation. The access operation denotes application of a bias stress to a sector to be accessed. For a plurality of sectors to be accessed, a batch access operation on all of the sectors and an access operation on a sector group partially selected can be performed. For example, the former operation is a batch erase operation and the latter one is a first chip erase operation.

FIG. 1 is a schematic diagram showing an access operation for, for example, a sector group partially selected and illustrates a case where sectors are arranged in row in the vertical direction. The group is constructed by three sectors having the same vertical row address $Z1(i)$ and different horizontal row addresses $Z2(0)$, $Z2(1)$, and $Z2(2)$. Among the sectors, the sector of $(Z1(i), Z2(0))$ is a defective sector.

Since the voltage control units are provided for each of the vertical rows and the horizontal rows, the bias applying method of this case is executed in such a manner that a bias is applied (ON) to the vertical row $Z1(i)$, a bias is not applied (OFF) to the horizontal row $Z2(0)$, and a bias is applied (ON) to the horizontal rows $Z2(1)$ and $Z2(2)$. When the voltage biases in both of the vertical and horizontal directions are applied, a voltage stress is applied to the sector at $(Z1(i), Z2(1))$ and the sector at $(Z1(i), Z2(2))$ (the hatched sectors in FIG. 1) and an access operation is performed on the sectors. In regards to the sector at $(Z1(i), Z2(0))$, the voltage bias in the vertical direction is applied but the voltage bias in the horizontal row $Z2(0)$ is not applied. Consequently, an access operation on the sector at $(Z1(i), Z2(0))$ is not performed (no voltage stress is applied). By a one-step bias applying control, a plurality of sectors to be accessed (hatched sectors in FIG. 1), other than a defective sector, are accessed.

Conventionally, in the case where a sector group partially selected includes a defective sector, it is necessary to access the sectors (in this case, in the hatched sector area in FIG. 1) one by one. In accordance with the present invention, good sectors other than the defective sector can be accessed by a single operation.

FIG. 2 is a schematic diagram showing an example of the batch access operation and illustrates a case where sectors are disposed in positions of vertical row addresses $Z1(0)$ to $Z1(2)$ and horizontal row addresses $Z2(0)$ to $Z2(2)$. It is assumed that a defective sector exists in the position of $(Z1(1), Z2(0))$. In this case, an operation for accessing the plurality of sectors to be accessed other than the defective sector can be completed by two steps.

In Step 1, a bias is applied (ON) to all of the vertical rows $Z1(0)$ to $Z1(2)$. With respect to the horizontal rows, a bias is not applied (OFF) to the horizontal row $Z2(0)$ where the defective sector exists and a bias is applied (ON) to the other horizontal rows $Z2(1)$ and $Z2(2)$. For the sectors in the horizontal rows $Z2(1)$ and $Z2(2)$ to which the voltage biases in both of the vertical and horizontal directions are applied, that is, the sectors disposed at $(Z1(0), Z2(1))$, $(Z1(0), Z2(2))$, $(Z1(1), Z2(1))$, $(Z1(1), Z2(2))$, $(Z1(2), Z2(1))$, and $(Z1(2), Z2(2))$ (the sectors hatched in Step 1 of FIG. 2), a voltage stress is applied and an access operation is performed. On the other hand, to the sectors in the horizontal row $Z2(0)$, that is, the sectors at $(Z1(0), Z2(0))$, $(Z1(1), Z2(0))$, and $(Z1(2), Z2(0))$, although the voltage bias in the vertical direction is applied, the voltage bias in the horizontal direction is not applied. Consequently, an access operation is not performed on these sectors (no voltage stress is applied).

In Step 2, with respect to the vertical rows, a bias is not applied (OFF) to the vertical row $Z1(1)$ where the defective sector exists and a bias is applied (ON) to the other vertical rows $Z1(0)$ and $Z1(2)$. With respect to the horizontal rows, a bias is applied (ON) to the horizontal row $Z2(0)$ where the defective sector exists, and no bias is applied (OFF) to the other horizontal rows $Z2(1)$ and $Z2(2)$. For the sectors in the horizontal row $Z2(0)$ other than the defective sector, that is, the sectors disposed at $(Z1(0), Z2(0))$ and $(Z1(2), Z2(0))$ (the sectors hatched in Step 2 in FIG. 2), a voltage stress is applied and an access operation is performed by applying both the voltage bias in the vertical direction and the voltage bias in the horizontal direction. To the other sectors in the vertical rows $Z1(0)$ and $Z1(2)$, that is, the sectors at $(Z1(0), Z2(1))$, $(Z1(0), Z2(2))$, $(Z1(2), Z2(1))$, and $(Z1(2), Z2(2))$, although the voltage bias in the vertical direction is applied, the voltage bias in the horizontal direction is not applied. Consequently, no voltage stress is applied to these sectors.

For the case of accessing the area of sectors in three vertical rows and three horizontal rows together, even if a defective sector is included, the sectors other than the defective sector can be accessed in two steps (a voltage stress can be applied). Consequently, the access operation can be completed by a small number of steps. The voltage stress is applied only once to the sectors other than the defective sector, so that an excessive voltage stress is not applied.

Conventionally, in the case where a defective sector is included in a sector group selected as a target of a batch access (for example, a batch erasing operation, various stress tests on good sectors, or a leak test on good sectors), it is necessary to access the sectors (in this case, the hatched sector areas shown in Steps 1 and 2 in FIG. 2) one by one. In the present invention, good sectors other than the defective sector can be accessed together by a two step process (twice).

Figure 3:
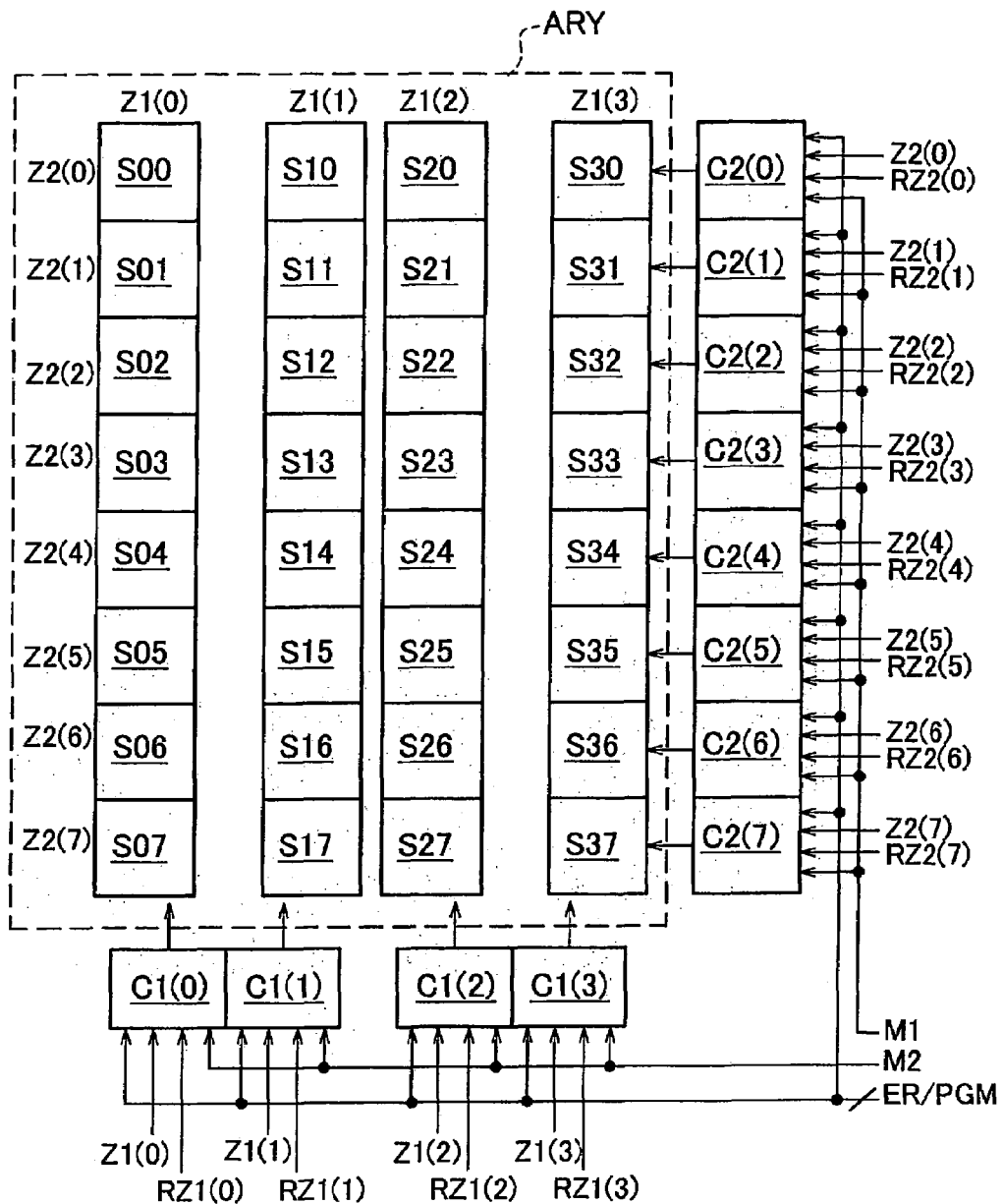
FIG. 3 is a circuit block diagram showing a storage device of an embodiment in accordance with the present invention.

FIG. 3 is a circuit block diagram showing a memory array ARY having a plurality of sectors and voltage control units provided for the vertical rows and horizontal rows of the sectors in the storage device in accordance with the embodiment of the present invention. The storage device to which the invention applies does not depend on the storage characteristics of memory cells and can be applied irrespective of whether the storage device is volatile or nonvolatile. As the embodiment, a nonvolatile storage device will be described as an example. As the embodiment, performing the batch access operation within two steps as shown in FIG. 2 will mainly be described.

In the memory cell array ARY, sectors S00 to S37 are arranged in four vertical rows (Z1(0) to Z1(3)) and eight horizontal rows (Z2(0) to Z2(7)).

In the vertical direction, vertical row voltage control units (C1(0) to C1(3)) are provided for the vertical rows (Z1(0) to Z1(3)). An erase operation control signal ER, a programming, operation control signal PGM, and a step-2 signal M2 indicative of the stress application period of Step 2 are input to each of the vertical row voltage control units (C1(0) to C1(3)). For the vertical rows, vertical row addresses Z1(0) to Z1(3) and vertical row defective signals RZ1(0) to RZ1(3) each indicating whether a defective sector exists in the corresponding vertical row or not are input. The vertical row voltage control units (C1(0) to C1(3)) control application of a voltage bias in the vertical direction to the vertical rows (Z1(0) to Z1(3)) in which the voltage control units are disposed. Specifically, the vertical row voltage control unit C1(0) controls application of a voltage bias to the sectors S00 to S07. Similarly, the vertical row voltage control units C1(1), C1(2), and C1(3) control application of the voltage bias to the sectors S10 to S17, S20 to S27, and S30 to S37, respectively.

In the horizontal direction, the horizontal row voltage control units (C2(0) to C2(7)) are provided for the horizontal rows (Z2(0) to Z2(7)), respectively. The erase operation control signal ER, programming operation control signal PGM, and a step-1 signal M1 indicative of the stress application period of Step 1 are input to each of the horizontal row voltage control units (C2(0) to C2(7)). For the horizontal rows, horizontal row addresses Z2(0) to Z2(7) and horizontal row defective signals RZ2(0) to RZ2(7) each indicating whether a defective sector exists in the corresponding horizontal row or not are input. The horizontal row voltage control units (C2(0) to C2(7)) control application of a voltage bias in the horizontal direction to the horizontal rows (Z2(0) to Z2(7)) in which the voltage control units are disposed. Specifically, the horizontal row voltage control unit C2(0) controls application of a voltage bias to the sectors S00 to S30. Similarly, the horizontal row voltage control units C2(1), C2(2), C2(3), C2(4), C2(5), C2(6), and C2(7) control application of the voltage bias to the sectors S01 to S31, S02 to S32, S03 to S33, S04 to S34, S05 to S35, S06 to S36, and S07 to S37, respectively.

In the vertical direction (vertical rows), local bit lines extend in sectors, and global bit lines extend across the plurality of sectors. Further, a well shared by a plurality of sectors extends in each vertical row. In the horizontal direction, local word lines (P2WL in FIG. 11 to be described later) extend in sectors, and global word lines (GWL in FIG. 11 to be described later) extend across the plurality of sectors.

For controlling application of the voltage bias in the vertical direction of the vertical row voltage control unit (C1($i$)), a well potential VNW shared by a plurality of sectors in each vertical row, a sub-decoder high-voltage VWL for controlling a sub decoder disposed for each of the sectors in which the local word line extends, and a control signal NEN for controlling a sub-decoder low-voltage power source switch which controls a sub-decoder low-voltage XDS of the sub decoder are used.

For controlling application of the voltage bias in the horizontal direction of the horizontal row voltage control unit (C2($i$)), a pair of global word lines (GWL, GWLB) shared by a plurality of sectors in each row, and a negative power source RNEGP for controlling a sub-decoder low-voltage power source switch which controls a sub-decoder low-voltage XDS of the sub decoder are used.

An erase operation and a programming operation of a nonvolatile storage device use a physical tunneling phenomenon of a memory cell caused by the voltage difference between the local word line and the well and a physical tunneling phenomenon of a memory cell between the local word line and the local bit line or between source lines of the memory cell. There is also a programming operation performed by using hot carriers and the like.

The erase operation control signal ER and the programming operation control signal PGM are signals output from a not shown control circuit for controlling an operation state and an operation timing is set for each access operation in response to an access operation command such as an external command. In the nonvolatile storage device, during the erase operation and the programming operation, a period of applying a voltage stress to a memory cell and a so-called verify operation of verifying a threshold voltage of a cell transistor after application of the voltage stress are alternately repeated. The erase operation control signal ER and the programming operation control signal PGM are signals for instructing a voltage bias to a memory cell.

The step-1 signal. M1 and the step-2 signal M2 indicative of the stress application periods of Steps 1 and 2, respectively, are signals output from a not shown control circuit at the time of the batch access operation shown in FIG. 2, and are signals for managing the voltage stress sequence. As shown in the bias application method of the batch access operation shown in FIG. 2, at the time of selecting all of the vertical rows and applying a bias in step 2, control has to be performed so as not to apply the bias only to the vertical row in which a defective sector exists in step 2. With respect to the horizontal rows, the bias applying control on a row in which the defective sector exists and that on rows in which no defective sector exists are different from each other. In step 1, a bias is not applied to only the row in which the defective sector exists. In step 2, the bias application control has to be changed. For such control, as shown in FIG. 3, the step 2 signal M2 is input to the vertical row voltage control units C1(0) to C1(3), and the step 1 signal M1 is input to the horizontal row voltage control units C2(0) to C2(7).

Further, the vertical row/horizontal row addresses (Z1(0) to Z1(3) and Z2(0) to Z2(7)) instructing a vertical row and a horizontal row and the vertical row/horizontal row defective signals (RZ1(0) to RZ1(3) and RZ2(0) to RZ2(7)) instructing a vertical row/horizontal row in which a defective sector exists are output in accordance with an address signal output control unit which will be described in connection with FIGS. 4 to 10.

Figure 4:
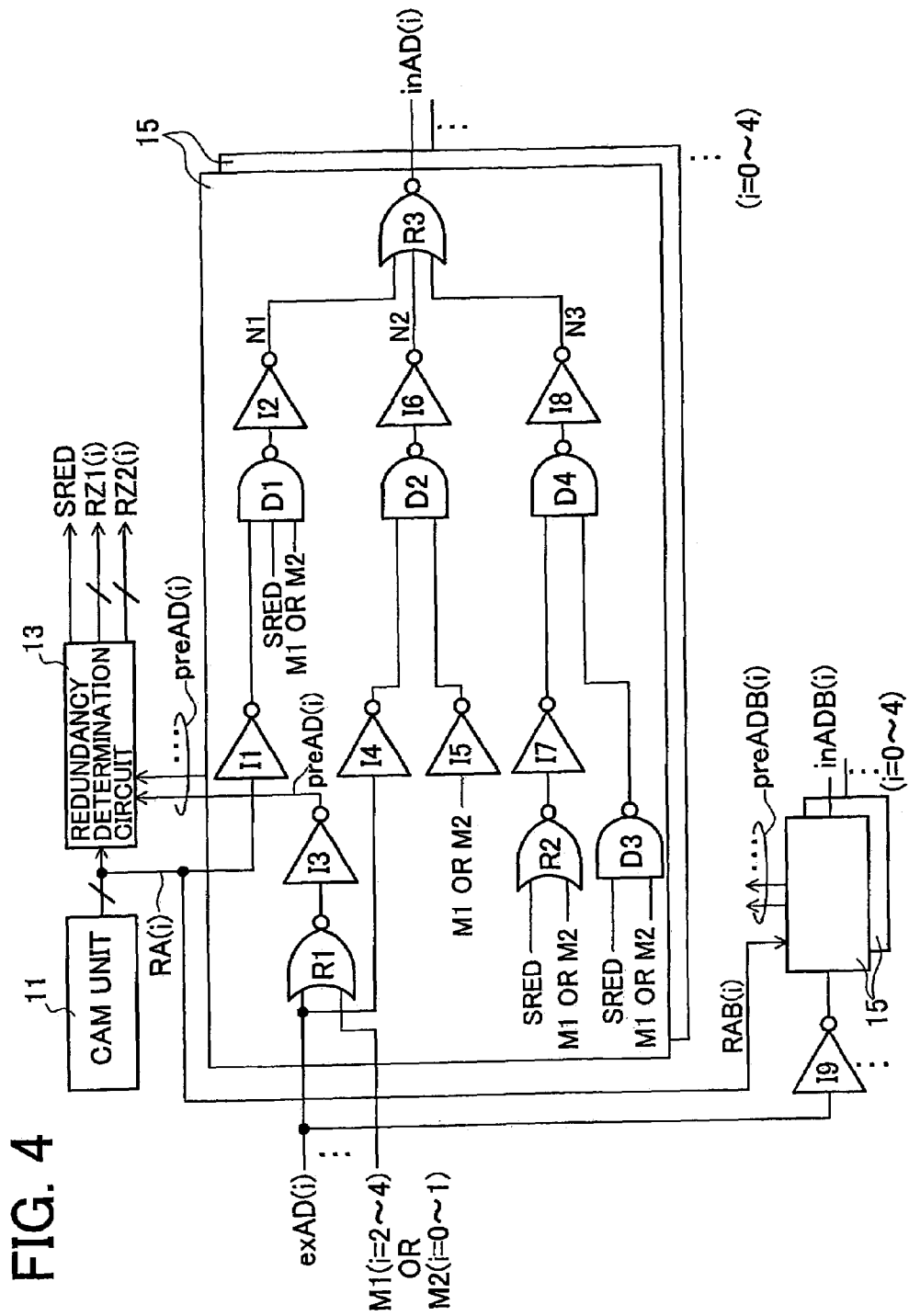
FIG. 4 is an inner address output control unit in accordance with the present invention.
Figure 5:
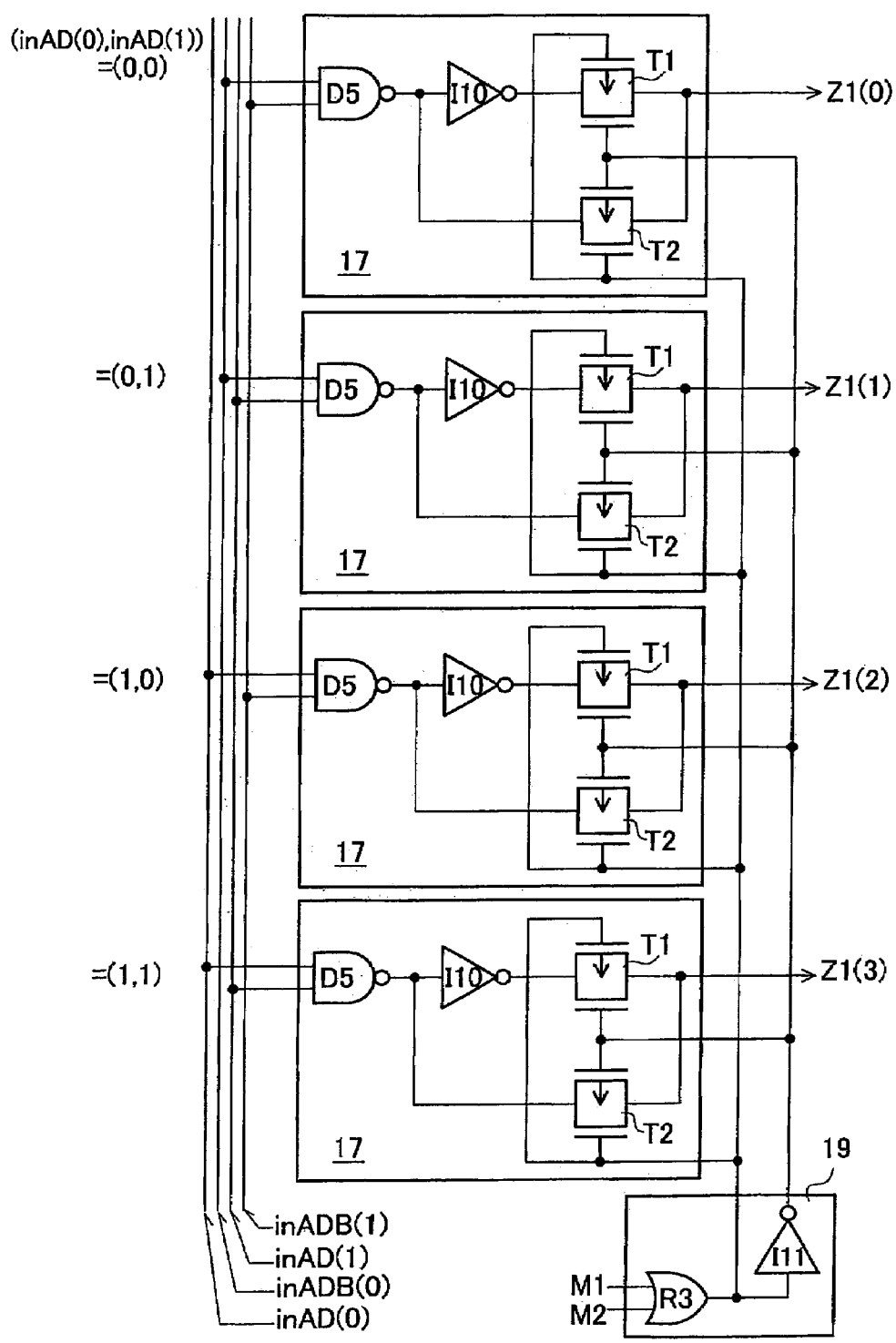
FIG. 5 is a decoder for a vertical row address in accordance with the present invention.
Figure 6:
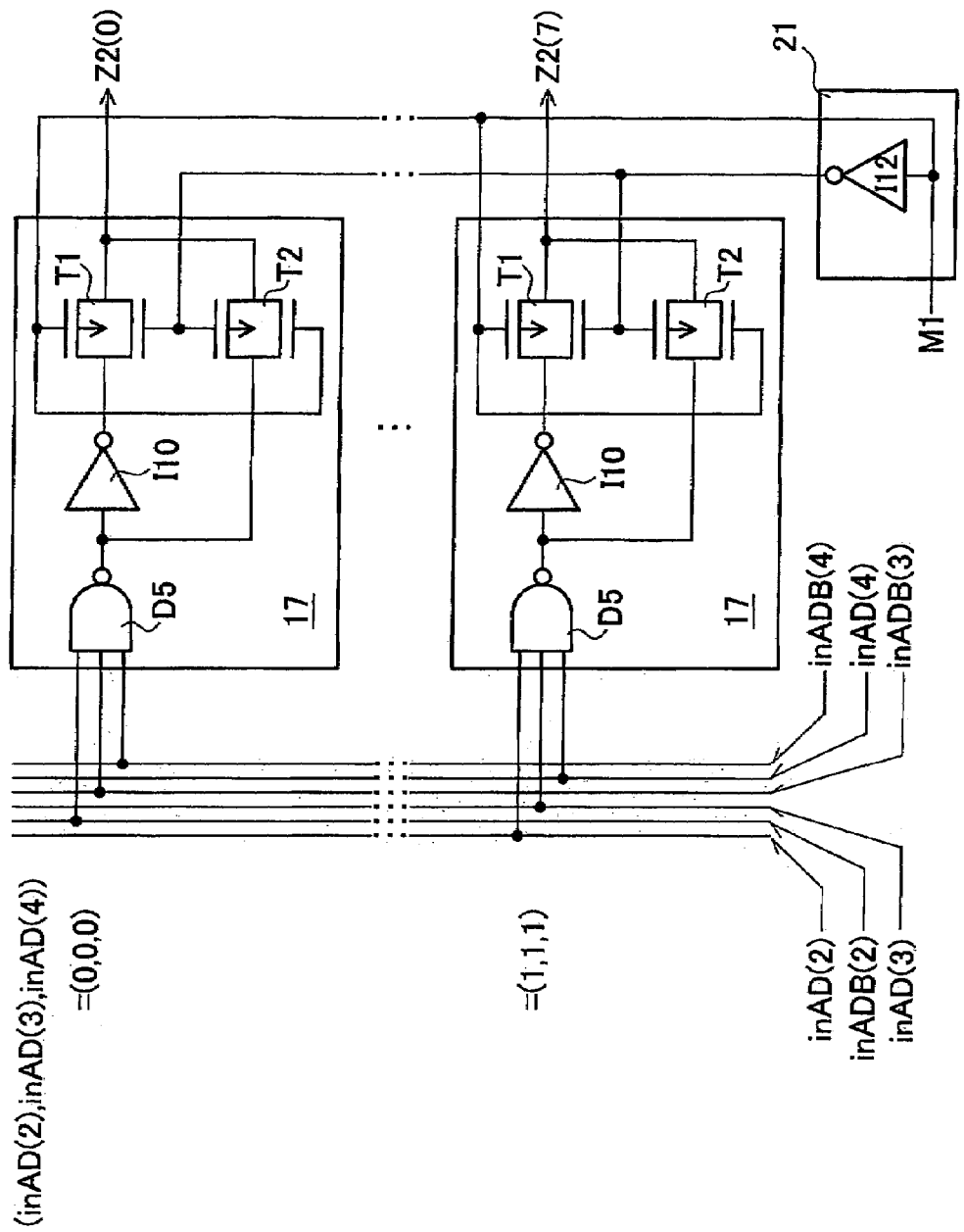
FIG. 6 is a decoder for a horizontal row address in accordance with the present invention.

FIGS. 4 to 6 show a vertical row address signal output control unit. FIG. 4 shows a control unit for outputting in-phase/opposite-phase internal address signals in AD(i)/in ADB(i) (where i=0 to 4) for input external addresses exAD (i) (where i=0 to 4). During a normal access operation performed on a sector unit basis, the in-phase/opposite-phase internal address signals in AD(i)/in ADB(i) are generated for each external address exAD(i). One of the internal address signals becomes high. In addition, a redundancy determination is made. The output control unit has an address buffer 15, a CAM unit 11 which is a nonvolatile storage device or the like and in which defective sector addresses RA(i) (where i=0 to 4) are prestored, and a redundancy determination circuit 13 for determining whether the external address exAD(i) and the defective sector address RA(i) match each other or not.

The address buffer 15 has a set to which the external address exAD(i) is directly input and, in addition, a set to which an address obtained by inverting the external address exAD(i) by an inverter gate I9 is input. From the address buffer 15, the internal address signal inAD(i) (where i=0 to 4) having the same phase as that of the external address exAD(i) and the internal address signal in ADB(i) (where i=0 to 4) having the phase opposite to that of the external address exAD(i) are output. For the high-level external address exAD(i), the in-phase internal address inAD(i) becomes high. For the low-level external address exAD(i), the opposite-phase internal address signal in ADB(i) becomes high. That is, the internal address signals in AD(i) and in ADB(i) output from the address buffer 15 are signals corresponding to the external address exAD(i).

The input external address exAD(i) and its inverted address are input to a NOR gate R1. To the other input terminal of the NOR gate R1, the step-2 signal M2 is input for the external addresses exAD(0) and exAD(1), and the step-1 signal M1 is input for the external addresses exAD(2) to exAD(4). An output signal from the NOR gate R1 is inverted by an inverter gate I3 and an address preAD(i) (where i=0 to 4) and an address preADB(i) (where i=0 to 4) for checking a match in the redundancy determination are output and supplied to the redundancy determination circuit 13.

The redundancy determination circuit 13 checks whether the defective sector address RA(i)/RAB(i) stored in the CAM unit 11 and the address preAD(i)/preADB(i) having the same address number i and the same phase/the opposite phase match each other or not. When combinations of high-levels exist in all of the address numbers (i=0 to 4), it is determined that the address preAD(i)/preADB(i) matches the address of a defective sector preliminarily stored, and a redundancy match signal SRED and vertical row and horizontal row addresses RZ1(i) and RZ2(i) (where i=0 to 4) in the vertical row/horizontal row of the defective sector decoded from the matched address are output.

The internal address signals in AD(i)/in ADB(i) output from the address buffer 15 are output from a NOR gate R3 having three inputs. The input terminals of the NOR gate R3 are connected to output terminals of inverter gates 12, 16, and 18 via nodes N1, N2, and N3, respectively.

The path leading to the node N1 is constructed by an inverter gate I1, the inverter gate I2 and a NAND gate D1. The defective sector address RA(i)/RAB(i) output from the CAM unit 11 is input to the inverter gate I1, and the output terminal of the inverter gate I1 is connected to the NAND gate D1. To the NAND gate D1, the step-1 signal M1 or the step-2 signal M2 and a redundancy match signal SRED are input. An output signal of the NAND gate D1 is input to the inverter gate I2.

Each of the defective sector addresses RA(i)/RAB(i) is input to the address buffer 15 corresponding to the external address exAD(i)/the inversion address of the external address. The step-1 signal M1 is input to the address buffers 15 of i=2 to 4, and the step-2 signal M2 is input to the address buffers 15 of i=0 to 1.

The path leading to the node N2 is constructed by inverter gates I4 and I5, the inverter gate I6 and a NAND gate D2. The external address exAD(i) or its inverted address are input to the inverter gate I4, and the step-1 signal M1 or the step-2 signal M2 is input to the inverter gate I5. Output signals from the inverter gates I4 and I5 are input to the NAND gate D2, and the output signal from the NAND gate D2 is input to the inverter gate I6.

The external address exAD(i) or its inversion address and the step-1 signal M1 or step-2 signal M2 are input to the corresponding address buffers 15 in a manner similar to the case of the system of the node N1.

The path leading to the node N3 is constructed by an inverter gate I7, the inverter gate I8; NAND gates D3 and D4, and a NOR gate R2. The redundancy match signal SRED and the step-1 signal M1 or step-2 signal M2 are input to the NOR gate R2 and the NAND gate D3. An output signal from the NOR gate R2 is input to the NAND gate D4 via the inverter gate I7. An output signal from the NAND gate D3 is directly input to the NAND gate D4. An output signal from the NAND gate D4 is input to the inverter gate I8.

The step-1 signal M1 or step-2 signal M2 is input to the corresponding address buffer 15 in a manner similar to the cases of the paths of the nodes N1 and N2.

FIGS. 5 and 6 show row decoders for decoding the internal address signals inAD(i) and in ADB(i) already decoded in FIG. 4 and selecting the vertical row addresses (Z1(0) to Z1(3)) and the horizontal row addresses (Z2(0) to Z2(7)) in which the sectors are disposed.

FIG. 5 shows the vertical row decoders for decoding vertical row addresses. A location in a vertical row is identified by the address number i=0 or 1. A vertical row decoder portion 17 is provided for each combination of the internal address signal in AD(0) or in ADB(0) and in AD(1) or in ADB(1). The vertical row addresses Z1(0) to Z1(3) are output from the vertical row decoder portions 17.

The vertical row decoder portion 17 has a NAND gate D5 to which the internal address signal in AD(0) or in ADB(0) and the internal address signal in AD(1) and in ADB(1) are input, and an inverter gate I10 to which an output signal of the NAND gate D5 is input. Output signals of the inverter gate I10 and the NAND gate D5 are output as internal address signals via transfer gates T1 and T2.

The transfer gates T1 and T2 are exclusively controlled to be conductive to output either an input signal or an output signal of the inverter gate I10. A transfer gate control unit 19 is constructed by an OR gate R3 and an inverter gate I11. To the OR gate R3, the step-1 signal M1 and the step-2 signal M2 are input. An output signal of the OR gate R3 controls a PMOS transistor of the transfer gate T1 and an NMOS transistor of the transfer gate T2. An output signal of the inverter gate I11 controls an NMOS transistor of the transfer gate T1 and a PMOS transistor of the transfer gate T2.

In the case where both the step-1 signal M1 and the step-2 signal M2 are low and inactive, an output signal of the OR gate R3 becomes low and the transfer gate T1 becomes conductive. On the other hand, when either the step-1 signal M1 or step-2 signal M2 is high and active, an output signal of the OR gate R3 becomes high, and the transfer gate T2 becomes conductive. The case where either the step-1 signal M1 or step-2 signal M2 is high corresponds to the case where the batch access operation shown in FIG. 2 is performed.

An output signal of the inverter gate I10 is a signal which is selected in response to a combination of internal address signals and becomes high. In the case of a normal access operation in which the batch access operation is not performed, the transfer gate T1 becomes conductive, and one of the vertical row addresses (Z1(0) to Z1(3)) selected in response to the combination of the internal address signals is selected. In contrast, in the case where not the normal access operation but the batch access operation is performed, the transfer gate T2 becomes conductive, and any of the vertical row addresses (Z1(0) to Z1(3)) which were not selected according to the combination of the internal address signals is selected.

FIG. 6 shows horizontal row decoders for decoding horizontal row addresses. A location in a horizontal row is identified by the address number i=2 to 4. The vertical row decoder portion 17 is provided for each combination of the internal address signal in AD(2) or in ADB(2) and in AD(4) or inADB(4), and the horizontal row addresses Z2(0) to Z2(7) are output.

The horizontal row address decoder shown in FIG. 6 has a transfer gate control unit 21 in place of the transfer gate control unit 19. The transfer gate control unit 21 has an inverter gate I12. To the inverter gate I12, the step-1 signal M1 is input. The step-1 signal M1 controls the PMOS transistor of the transfer gate T1 and the NMOS transistor of the transfer gate T2. An output signal of the inverter gate I12 controls the NMOS transistor of the transfer gate T1 and the PMOS transistor of the transfer gate T2.

In the case where the step-1 signal M1 is low and inactive, the transfer gate T1 becomes conductive. On the other hand, when the step-1 signal M1 is high and active, the transfer gate T2 becomes conductive. The period in which the step-1 signal M1 is high corresponds to the period of Step 1 in the batch access operation shown in FIG. 2.

In the case of a normal access operation in which the batch access operation is not performed and the period of Step 2 in the batch access operation, the transfer gate T1 becomes conductive, and one of the horizontal row addresses (Z2(0) to Z2(7)) selected according to the combination of the internal address signals is selected. In contrast, during the period of Step 1 in the batch access operation, the transfer gate T2 becomes conductive, and any of the horizontal row addresses (Z2(0) to Z2(7)) which were not selected according to the combination of the internal address signals is selected.

FIGS. 7 to 10 show operation waveforms of the internal address output control unit illustrated in FIG. 4. The control for address signals, including redundancy match determination, is executed. Although not shown, when there is a defective sector in sectors to be subjected to the batch access operation, the vertical row and horizontal row addresses RZ1(i) and RZ2(i) of the defective sector are decoded by the redundancy determination circuit 13 and output. From the internal address signals in AD(i) and in ADB(i) output from the address decoder 15, the vertical row and horizontal row addresses are decoded by the vertical row and horizontal row decoders (FIGS. 5 and 6).

Figure 7:
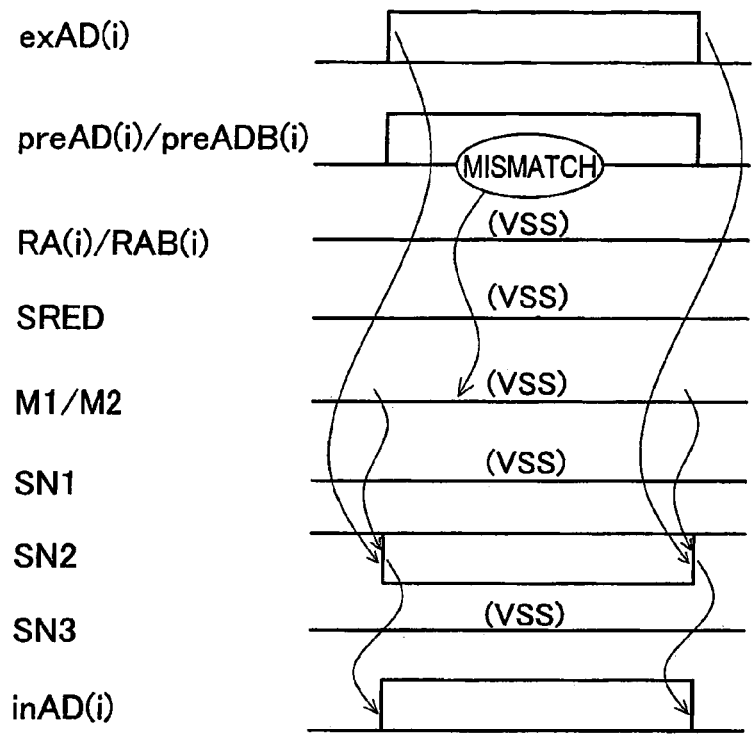
FIG. 7 shows an operation waveform (1) of the inner address output control unit (in the case where no defective sector exists during normal access) in accordance with the present invention.
Figure 8:
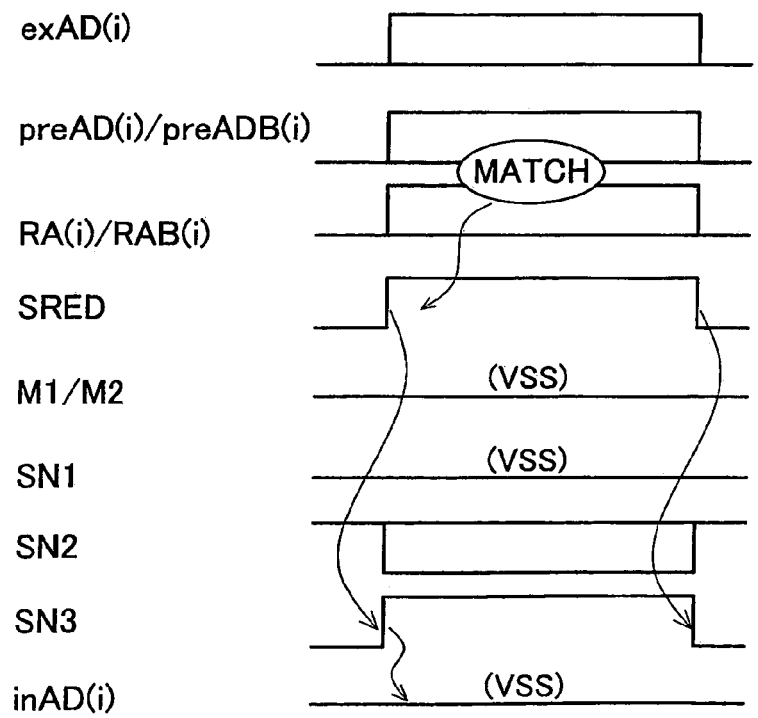
FIG. 8 shows an operation waveform (2) of the inner address output control unit (in the case where there is a defective sector during normal access) in accordance with the present invention.

FIGS. 7 and 8 show operation waveforms during the normal access operation in which the batch access operation is not performed. FIG. 7 shows a case where there is no defective sector to be redundancy repaired. FIG. 8 shows a case where there is a defective sector to be redundancy repaired. According to the external address exAD(i), the address preAD(i)/preADB(i) for checking a match is output. In the case where the external address exAD(i) is high, the address preAD(i) becomes high. In the case where the external address exAD(i) is low, the address preADB(i) becomes high.

The addresses preAD(i) and preADB(i) for checking a match are compared with the defective sector addresses RA(i) and RAB(i) in the redundancy determination circuit 13. In the case of a mismatch (FIG. 7), the redundancy match signal SRED remains low. In the case of a match (FIG. 8), the redundancy match signal SRED is switched to high.

In FIGS. 7 and 8, the batch access operation is not performed, so that the step-1 signal M1 and the step-2 signal M2 are maintained low. Consequently, a signal SN1 output to the node N1 remains low. A signal SN2 output to the node N2 is output according to the external address exAD(i). That is, in the address buffer 15 to which the external address exAD(i) is input, a signal having the signal level and the phase opposite to that of the external address exAD(i) is output. In the address buffer 15 to which the inversion signal of the external address exAD(i) is input, a signal having the logic level and the same phase as that of the external address exAD(i) is output.

On the other hand, since the step-1 signal M1 and the step-2 signal M2 are maintained low, a signal SN3 output to the node N3 and having the logic level different from that of the redundancy match signal SRED is output. In the case where the redundancy match signal SRED is low (FIG. 7), a low level signal is output. In the case where the redundancy match signal SRED is high (FIG. 8), a high level signal is output.

According to the logic levels of the signals SN1 to SN3 input to the NOR gate R3, in the case of FIG. 7, the inversion signal of the signal SN2 is output. In the address buffer 15 to which the external address exAD(i) is input, a signal having the signal level and the same phase as that of the external address exAD(i) is output. In the address buffer 15 to which the inversion signal of the external address exAD(i) is input, a signal having the logic level and the phase opposite to the external address exAD(i) is output. Specifically, when the external address exAD(i) is high, the internal address signal in AD(i) is output at high. When the external address exAD(i) is low, the internal address signal in ADB(i) is output at high. The internal address signals are decoded by the vertical row decoder.

In the vertical row decoder, as shown in FIG. 5, a control is performed by the transfer gate control unit 19 and the transfer gate T1 becomes conductive. A vertical row address corresponding to the internal address signals in AD(i) and in ADB(i) which are decoded by the NAND gate D5 and the inverter gate I10, become high, and are selected.

In the case of FIG. 8, in response to the signal SN3, a low-level signal is output. Since the external address exAD (i) matches the defective sector address RA(i), all of the internal address signals in AD(i) and in ADB(i) which are output in accordance with the external address exAD(i) are held low, and access to a defective sector is inhibited. A redundant sector to be accessed for redundancy repair is selected in accordance with the vertical row address RZ1(i) which is decoded and output by the redundancy determination circuit 13.

In the horizontal row decoder, as shown in FIG. 6, a control is performed by the transfer gate control unit 21 and the transfer gate T1 becomes conductive. A horizontal row address is decoded by the NAND gate D5 and the inverter gate I10. All of the internal address signals in AD(i) and in ADB(i) are held low, and access to the defective sector is inhibited. A redundant sector to be accessed for redundancy repair is selected in accordance with the horizontal row address RZ2(i) which is decoded and output by the redundancy determination circuit 13.

Figure 9:
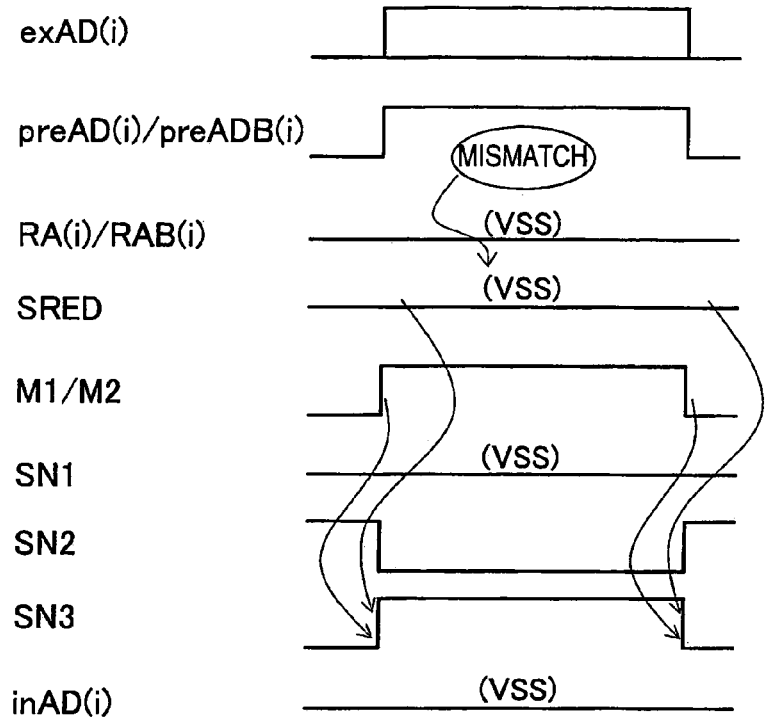
FIG. 9 shows an operation waveform (3) of the inner address output control unit (in the case where no defective sector exists in a batch access) in accordance with the present invention.
Figure 10:
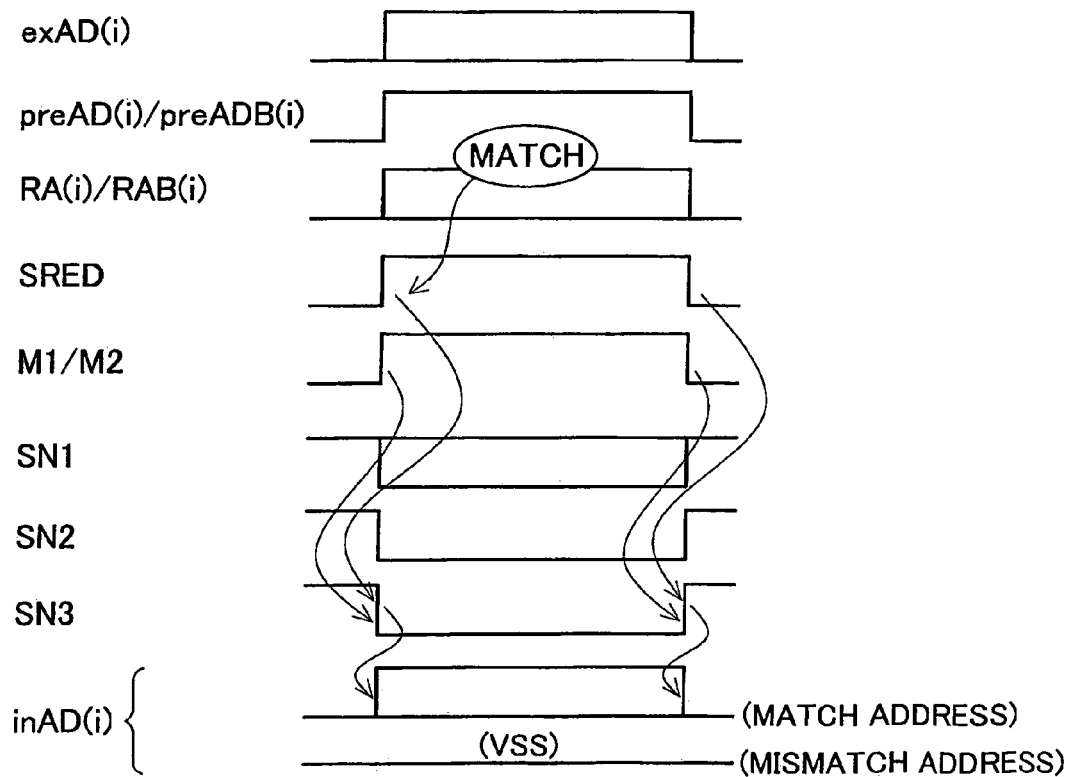
FIG. 10 shows an operation waveform (4) of the inner address output control unit (in the case where there is a defective sector in a batch access) in accordance with the present invention.

FIGS. 9 and 10 show operation waveforms during the batch access operation. FIG. 9 shows the case where there is no defective sector to be redundancy repaired. FIG. 10 shows the case where there is a defective sector to be redundancy repaired. Since the step-1 signal M1 or step-2 signal M2 becomes high, irrespective of the input external address exAD(i), all of the addresses preAD(i) and preADB (i) for checking a match become high.

The addresses preAD(i) and preADB(i) for checking for a match at high are compared with the defective sector addresses RA(i) and RAB(i) in the redundancy determination circuit 13 to check for a match. If the address of the defective sector is stored in the CAM unit 11, the predetermined defective sector addresses RA(i) and RAB(i) are high, so whether the address matches or not is determined. In the case where no address is stored, all of the defective sector addresses RA(i) and RAB(i) show low and a mismatch is determined. In the case of a mismatch (FIG. 9), the redundancy match signal SRED is held low. In the case of a match (FIG. 10), the redundancy match signal SRED is inverted to a high level.

FIGS. 9 and 10 show the case of the batch access operation, and the step-1 signal M1 or step-2 signal M2 becomes high. Consequently, the signal SN2 output to the node N2 becomes low. In the case of FIG. 9, since the redundancy match signal SRED is low, the signal SN1 to be output to the node N1 becomes low. In the case of FIG. 10, since the redundancy match signal SRED is high, the address buffer 15 to which the defective sector addresses RA(i) and RAB(i) stored in the CAM unit 11 are input becomes low. The other address buffers 15 become high. Further, in the case of FIG. 9, since the redundancy match signal SRED is low, the signal SN3 output to the node N3 becomes high. In the case of FIG. 10, the redundancy match signal SRED is high, so that the signal SN3 becomes low. Consequently, in the case of FIG. 9, the internal address signals in AD(i) and in ADB(i) to be output become low for all of the addresses. In the case of FIG. 10, signals corresponding to the defective sector addresses RA(i) and RAB(i) stored in the CAM unit 11 become high, and signals corresponding to the other addresses become low.

As shown in FIG. 5, the vertical row decoder is controlled by the transfer gate control unit 19. During the period of the batch access operation, the transfer gate T2 becomes conductive. Signals from the NAND gate D5 are output as the vertical row addresses Z1(0) to Z1(3) without being inverted by the inverter gate I10. In the case where no defective sector exists as shown in FIG. 9, signals output from the NAND gate D5 become high for all of the internal address signals in AD(i) and in ADB(i). In the case where a defective sector exists as shown in FIG. 10, the signal of the address corresponding to the defective sector in the internal address signals in AD(i) and in ADB(i) becomes low. The other address signals become high. The vertical row address of the defective sector is not selected and the other vertical row addresses are selected. In Steps 1 and 2 during the batch access operation, all of the vertical row addresses Z1(0) to Z1(3) other than the vertical row address of the defective sector are selected.

As shown in FIG. 6, the horizontal row decoder is controlled by the transfer gate control unit 21. During the period of Step 1 of the batch access operation, the transfer gate T2 becomes conductive. During the period of Step 2, the transfer gate T1 becomes conductive. During the period of Step 2, signals are output via the inverter gate I10. During the period of Step 1, signals are output from the NAND gate D5 without being inverted by the inverter gate I10. In the case where no defective sector exists, as shown in FIG. 9, all of the internal address signals in AD(i) and in ADB(i) become low. During the period of Step 1, all of the horizontal row addresses Z2(0) to Z2(7) become high. During the period of Step 2, all of the horizontal row addresses Z2(0) to Z2(7) become low. In the case where a defective sector exists, as shown in FIG. 10, during the period of Step 1, only the horizontal row address of the defective sector becomes low and the other horizontal row addresses become high. During the period of Step 2, only the horizontal row address of the defective sector becomes high, and the other horizontal row addresses become low.

Figure 11:
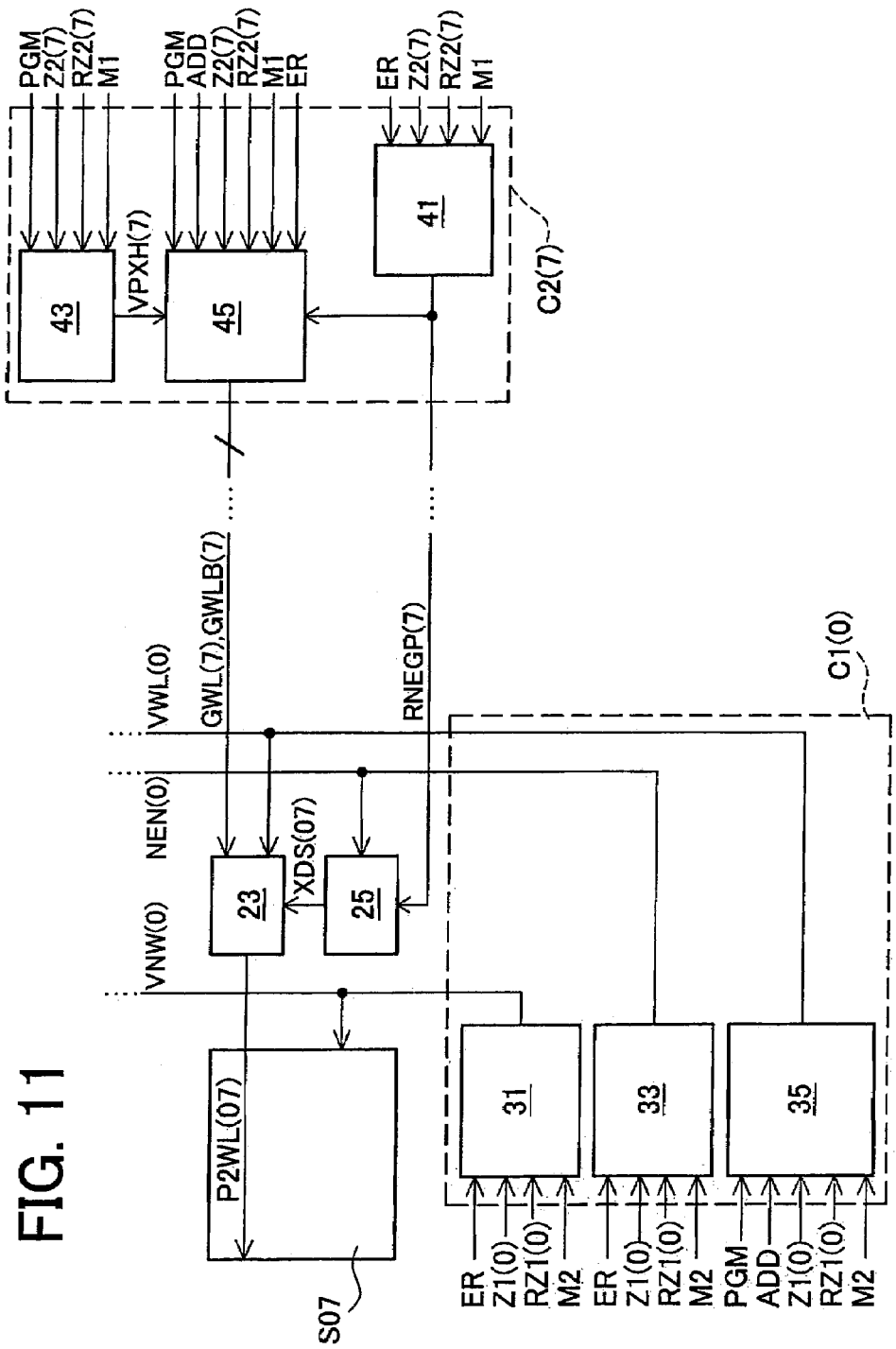
FIG. 11 is a circuit block diagram of a control circuit for applying a bias to a sector S07 in the circuit block diagram of FIG. 3 in accordance with the present invention.

FIG. 11 is related to the circuit block diagram of FIG. 3 and is a circuit block diagram showing the circuit configuration of a control circuit for applying a voltage bias to the sector S07. The control circuit includes: a sub decoder 23 for controlling a local word line P2WL(07) in the sector S07; a sub-decoder low-voltage power source switch 25 for outputting a low voltage to the sub decoder 23; a well potential control unit 31 for controlling a well potential in the sector S07; a sub-decoder low-voltage power source control unit 33 for controlling the switching of the sub-decoder low-voltage power source switch 25; a sub-decoder high-voltage power source control unit 35 for outputting a high voltage to the sub decoder 23 at the time of programming and data reading; a word line negative voltage supplying unit 41 for outputting a negative power to the sub-decoder low-voltage power source switch 25 and a main decoder 45; a main-decoder high-voltage power source control unit 43 for outputting a high voltage to the main decoder 45; and the main decoder 45 for controlling global word lines GWL(7) and GWLB(7).

A vertical row voltage control unit C1(0) includes the well potential control unit 31, sub-decoder low-voltage power source control unit 33, and sub-decoder high-voltage power source control unit 35. A horizontal row voltage control unit C2(7) includes the word line negative voltage supplying unit 41, main-decoder high-voltage power source control unit 43, and main decoder 45. FIGS. 12 to 19 show concrete examples of the circuit blocks. In the circuit blocks in FIGS. 12 to 19, suffixes indicative of the locations are not written.

Figure 12:
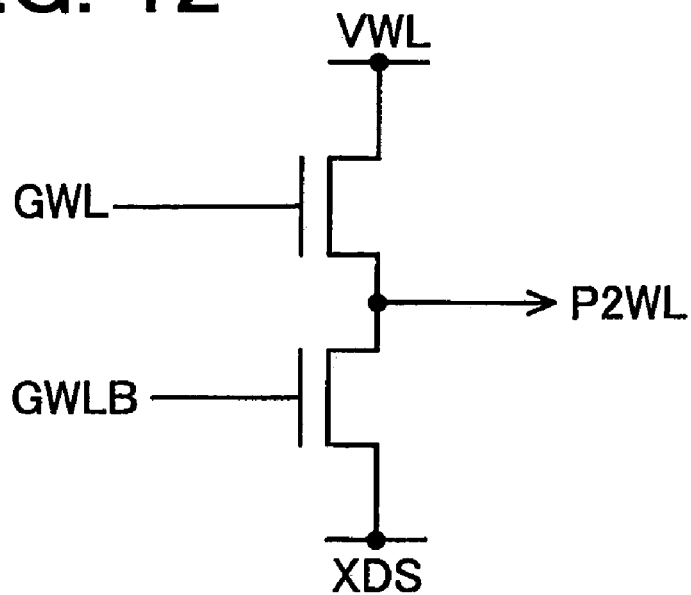
FIG. 12 shows a concrete example of a sub decoder in accordance with the present invention.

FIG. 12 shows a concrete example of the sub decoder 23. In the sub decoder 23, a sub-decoder high-voltage VWL or a sub-decoder low-voltage XDS is supplied to the local word line P2WL via NMOS transistors to which global word lines GWL and GWLB having complementary signals to each other are connected.

Figure 13:
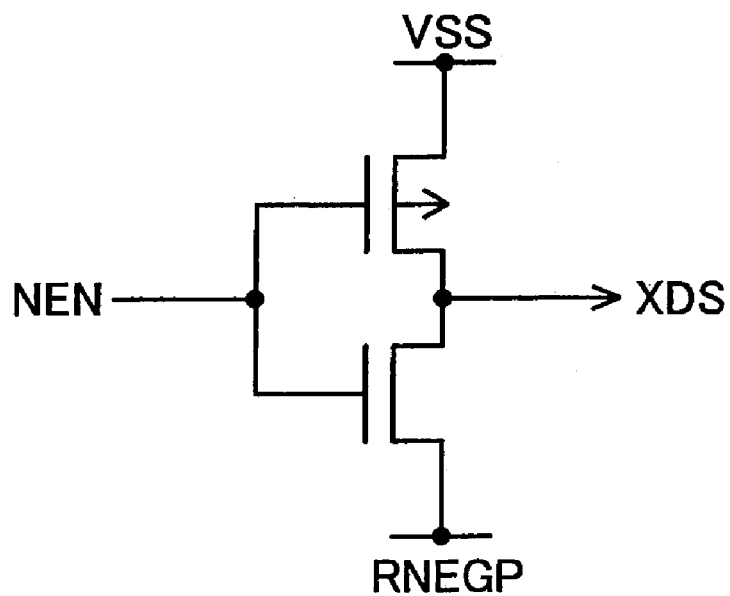
FIG. 13 shows a concrete example of a sub-decoder low-voltage power source switch in accordance with the present invention.

FIG. 13 shows a concrete example of the sub-decoder low-voltage power source switch 25. The sub-decoder low-voltage power source switch 25 takes the form of an inverter gate using a ground voltage as the high-voltage-side power and a negative power RNEGP output from the word line negative voltage supplying unit 41 as the low-voltage-side power, and outputs the sub-decoder low-voltage XDS in accordance with the control signal NEN output from the sub-decoder low-voltage power source control unit 33.

Figure 14:
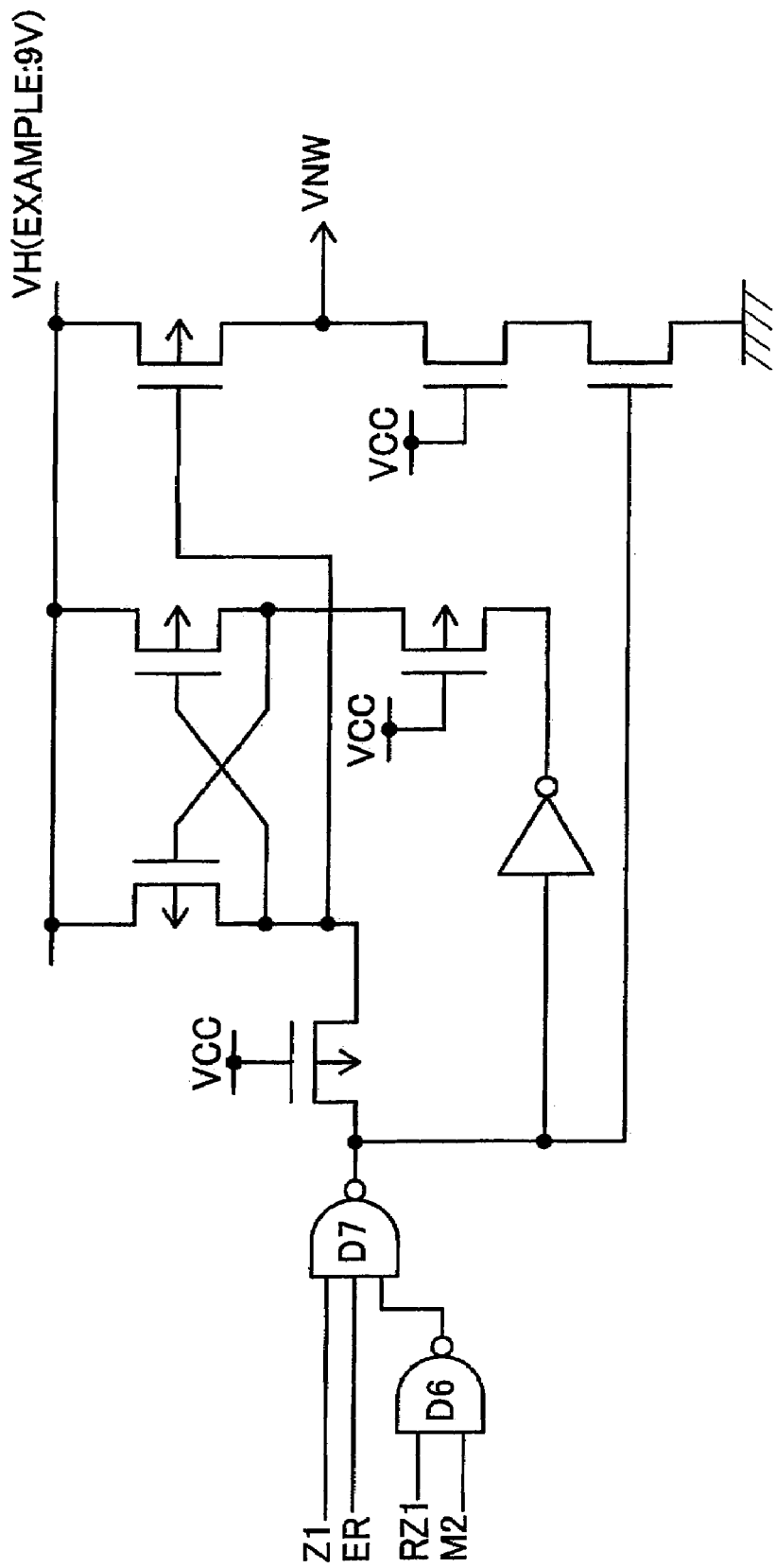
FIG. 14 shows a concrete example of a well potential control unit in accordance with the present invention.

FIG. 14 shows a concrete example of the well potential control unit 31. The well potential control unit 31 has a NAND gate D6 to which the vertical row defective signal RZ1 and the step-2 signal M2 are input, and a NAND gate D7 to which an output signal of the NAND gate D6, the vertical row address Z1, and the erase operation control signal ER are input. The well potential control unit 31 is controlled by the NAND gate D71 and the result thereof is output as a well potential VNW via a level shifter and a latch circuit. When an output signal of the NAND gate D7 is low, a high voltage VH (for example, 9V) is output. When the output signal is high, a ground voltage is output.

Figure 15:
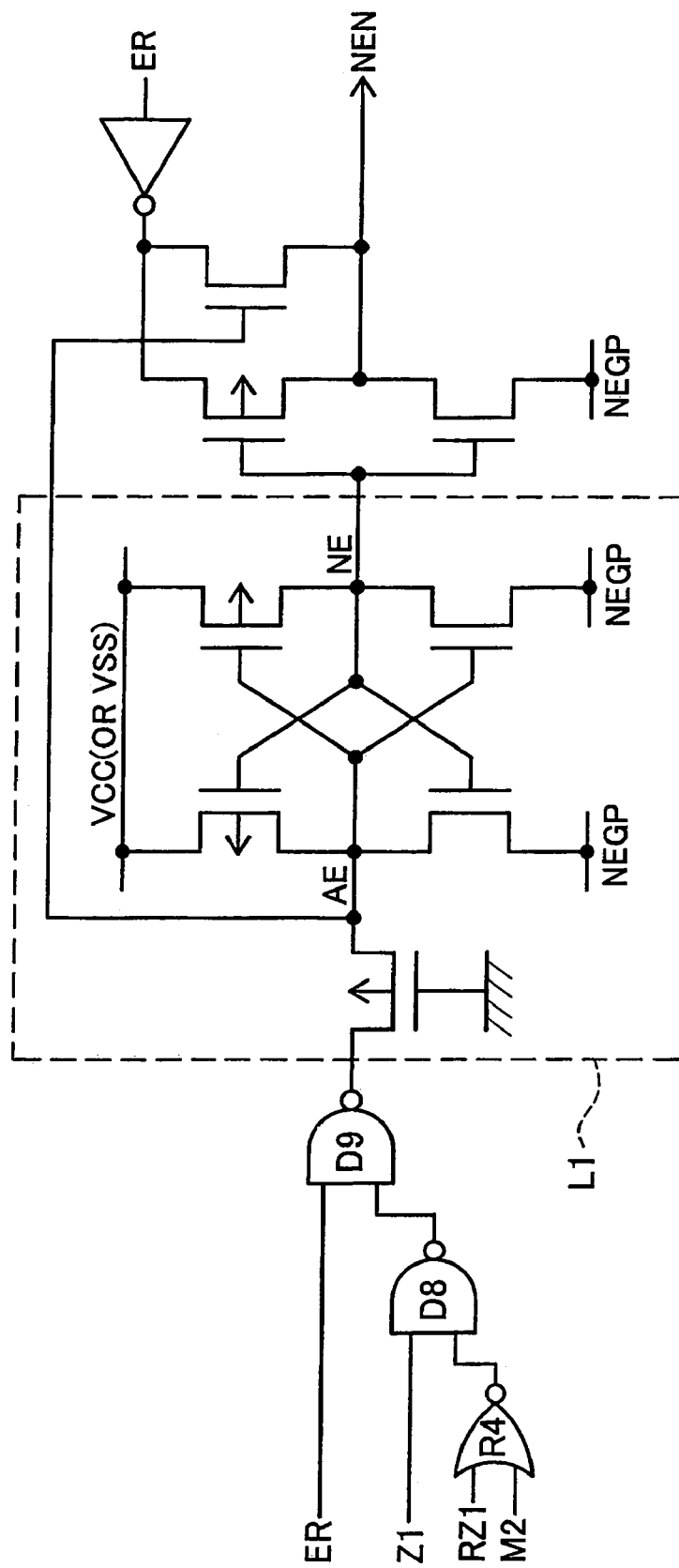
FIG. 15 shows a concrete example of a sub-decoder low-voltage power source control unit in accordance with the present invention.

FIG. 15 shows a concrete example of the sub-decoder low-voltage power source control unit 33. The sub-decoder low-voltage power source control unit 33 has a NOR gate R4 to which the vertical row defective signal RZ1 and the step-2 signal M2 are input, a NAND gate D8 to which an output signal of the NOR gate R4 and the vertical row address Z1 are input, and a NAND gate D9 to which an output signal of the NAND gate D8 and the erase operation control signal ER are input. The sub-decoder low-voltage power source control unit 33 is controlled by the NAND gate D9 and outputs the control signal NEN via a level shifter and the latch circuit L1. When an output signal of the NAND gate D9 is low, a negative voltage NEGP (for example, −9V) is output. When the output signal is high, when an erase access operation is performed and the erase operation control signal ER is high, the ground voltage is output and, when an access operation other than the access operation for erase is performed and the erase operation control signal ER is low, the power source voltage is output.

Figure 16:
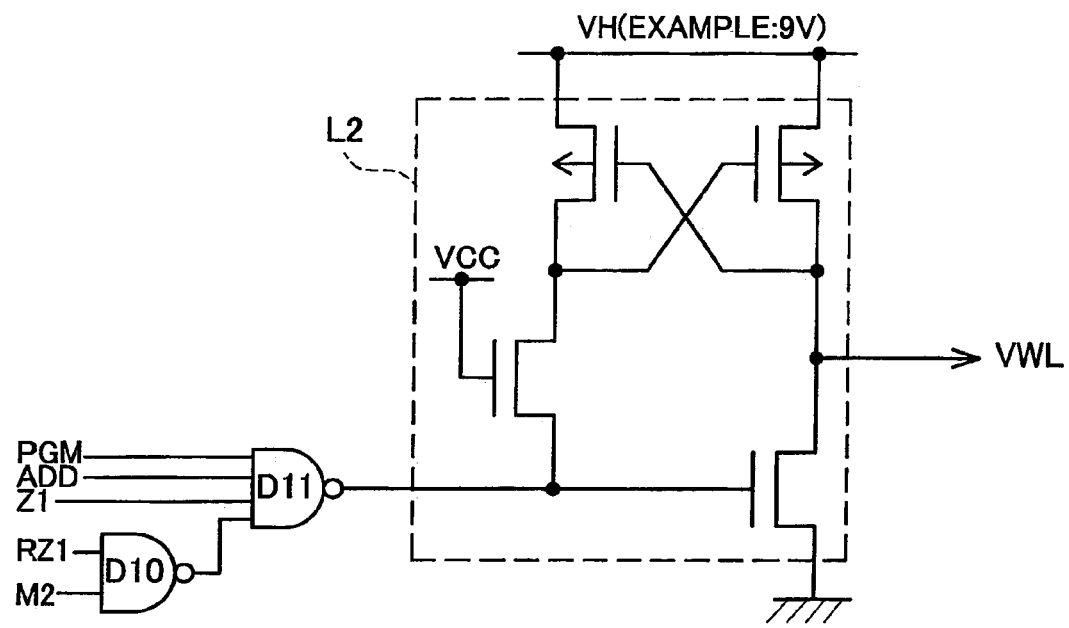
FIG. 16 shows a concrete example of a sub-decoder high-voltage power source control unit in accordance with the present invention.

FIG. 16 shows a concrete example of the sub-decoder high-voltage power source control unit 35. The sub-decoder high-voltage power source control unit 35 has a NAND gate D10 to which the vertical row defective signal RZ1 and the step-2 signal M2 are input, and a NAND gate D11 to which an output signal of the NAND gate D10, the programming operation control signal PGM, and the vertical row address Z1 are input. The sub-decoder high-voltage power source control unit 35 is controlled by an output signal of the NAND gate D11 and outputs the sub-decoder high voltage VWL via a level shifter and the latch circuit L2. In the case where an output signal of the NAND gate D11 is low, a high voltage VH (for example, 9V) is output. In the case where the output signal is high, the ground voltage is output.

Figure 17:
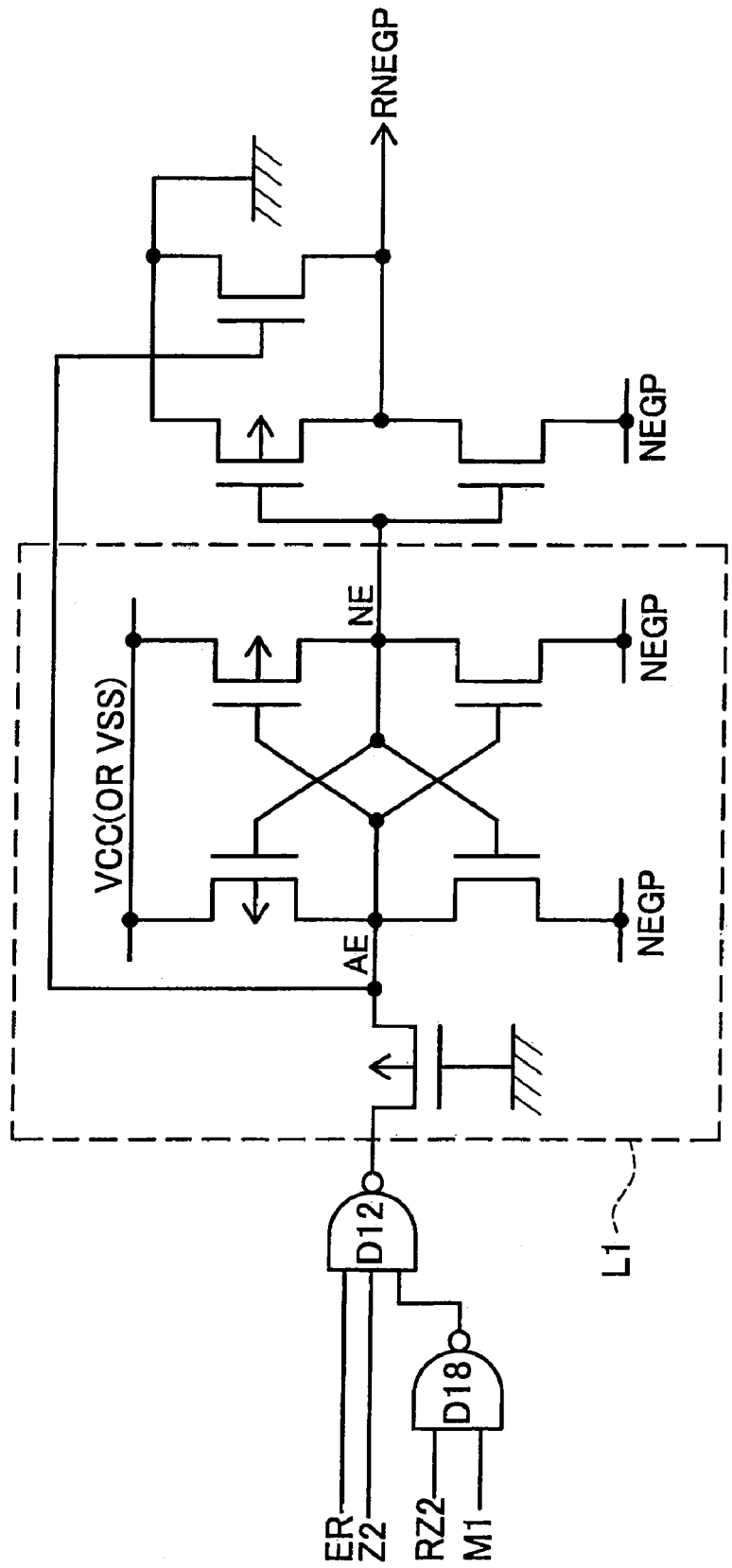
FIG. 17 shows a concrete example of a word line negative voltage supplying unit in accordance with the present invention.

FIG. 17 shows a concrete example of the word line negative voltage supplying unit 41. The word line negative voltage supplying unit 41 has a NAND gate D18 to which the horizontal row defective signal RZ2 and the step-1 signal M1 are input, and a NAND gate D12 to which an output signal of the NAND gate D18, the erasure operation control signal ER, and the horizontal row address Z2 are input. The word line negative voltage supplying unit 41 is controlled by an output signal of the NAND gate D12 and outputs the negative voltage RNEGP via a level shifter and the latch circuit L1. In the case where an output signal of the NAND gate D12 is low, a low voltage NEGP (for example, −9V) is output. In the case where the output signal is high, the ground voltage is output.

Figure 18:
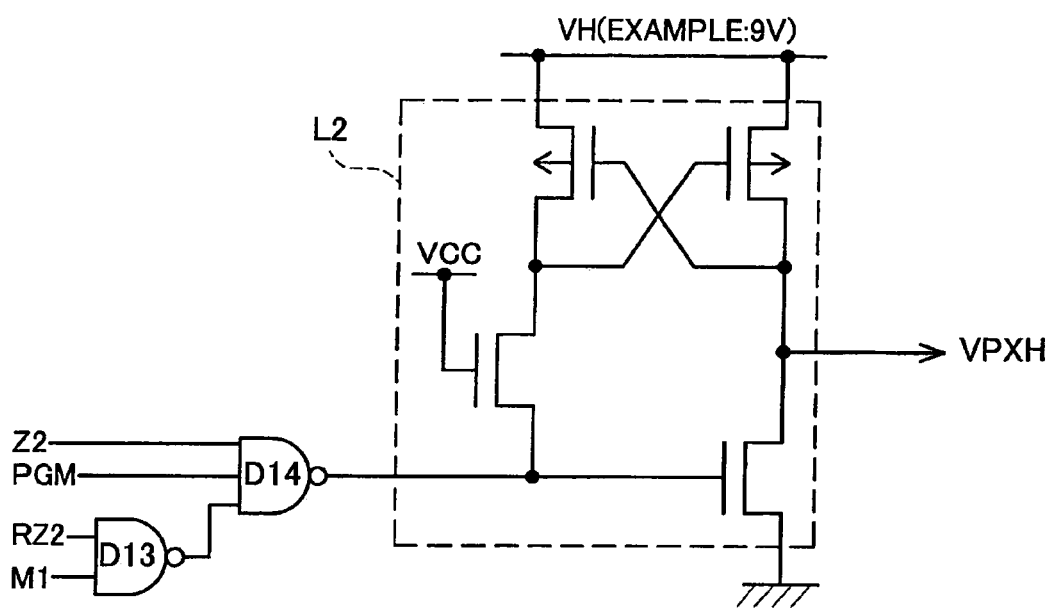
FIG. 18 shows a concrete example of a main-decoder high-voltage power source control unit in accordance with the present invention.

FIG. 18 shows a concrete example of the main-decoder high-voltage power source control unit 43. The main-decoder high-voltage power source control unit 43 has a NAND gate D13 to which the horizontal row defective signal RZ2 and the step-1 signal M1 are input, and a NAND gate D14 to which an output signal of the NAND gate D13, the horizontal row address Z2, and the programming operation control signal PGM are input. The main-decoder high-voltage power source control unit 43 is controlled by an output signal of the NAND gate D14 and outputs a main-decoder high voltage VPXH via a level shifter and the latch circuit L2. In the case where an output signal of the NAND gate D14 is low, a high voltage VH (for example, 9V) is output. In the case where the output signal is high, the ground voltage is output.

Figure 19:
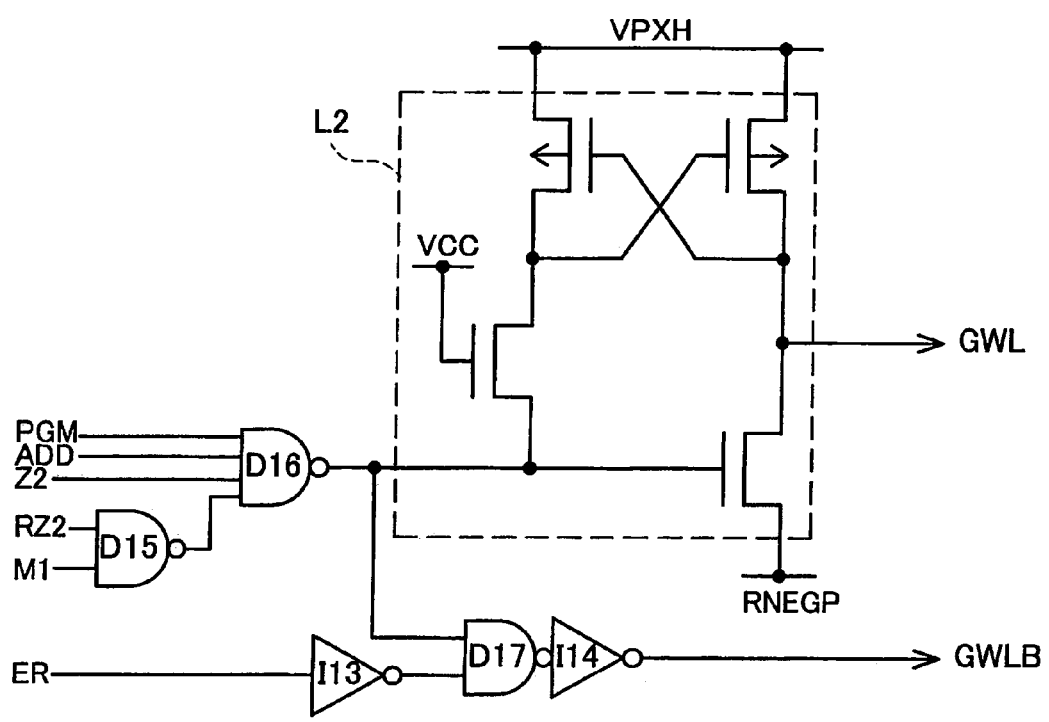
FIG. 19 shows a concrete example of a main decoder in accordance with the present invention.

FIG. 19 shows a concrete example of the main decoder 45. The main decoder 45 has a NAND gate D15 to which the horizontal row defective signal RZ2 and the step-1 signal M1 are input, and a NAND gate D16 to which an output signal of the NAND gate D15, the programming operation control signal PGM, an address signal ADD other than a Z1 or Z2 assigning address, and the horizontal row address Z2 are input. The main decoder 45 is controlled by an output signal of the NAND gate D16 and outputs a voltage (for example, 9V) to the global word line GWL. In the case where an output signal of the NAND gate D16 is low, the main-decoder high voltage VPXH is output. In the case where the output signal is high, the negative voltage (for example, −9V) is output.

The logic of the erase operation control signal ER is inverted by an inverter gate I13 and the resultant signal is input to a NAND gate D17. To the NAND gate D17, an output signal of the NAND gate D16 is also input. An output signal of the NAND gate D17 is inverted by an inverter gate I14 and the resultant signal is output to the global word line GWLB.

FIGS. 20 and 21 show the voltage bias states of the signals of different access operations. The voltage bias states will be described by using, as an example, the case of applying a voltage bias to sectors other than a defective sector in two steps in the batch access operation shown in FIG. 2. The voltage bias states of the sector S07 as a defective sector, and sectors S06 and S17 as the peripheral sectors are shown. The access operations include, as access operations for application of the voltage bias in two steps, an erase (ER) stress operation, a programming (PGM) stress operation, and a leak current test (HTRB leak) by a stress test. As the access operation by applying a voltage bias in one step, a first chip erase (ER) operation is shown. FIGS. 20 and 21 will be described with reference to FIG. 3 and FIGS. 11 to 19.

First, in FIG. 20, the erasure (ER) access operation will be described. In step 1, a voltage bias is not applied to the vertical row Z2(7) including the defective sector S07. "0"V is indicated in the boxes of Z2 in the sectors S07 and S17.

With respect to the normal sector S06 to which the voltage bias is applied, by the word line negative voltage supplying unit 41, the horizontal row address signal Z2 and the erase operation control signal ER are set to high, and the negative voltage RNEGP becomes −9V. The well potential control unit 31, the vertical row address Z1 and the erase operation control signal ER are set to high, and the well potential VNW becomes 9V. The sub-decoder low-voltage power source control unit 33, the vertical row address Z1 and the erase operation control signal ER are set to high and the control signal NEN become the ground voltage. As for the sub-decoder low-voltage power source switch 25, since the negative voltage RNEGP is −9V and the control signal NEN is the ground voltage, the sub-decoder low voltage XDS becomes −9V. As for the sub decoder 23, the global word line GWL becomes −9V, the global word line GWLB and the sub-decoder high voltage VWL become the ground voltage, and the local word line P2WL becomes −9V. In the main-decoder high-voltage power source control unit 43, since the access operation is not the programming operation, the main-decoder high-voltage VPXH is the ground potential. As for the main decoder 45, the negative voltage RNEGP is −9V, the global word line GWL is −9V, the erase operation control signal ER is high, and the global word line GWLB becomes the ground voltage. In the sub-decoder high-voltage power source control unit 35, since the access operation is not the programming operation, the sub-decoder high-voltage VWL is the ground potential. A voltage bias is not applied to the defective sector S07. As for the word line negative voltage supplying unit 41, the horizontal row address Z2 becomes the ground voltage and the negative voltage RNEGP becomes the ground voltage. As for the well potential control unit 31, the vertical row address Z1 and the erase operation control signal ER become high, and the well potential VNW becomes 9V. As for the sub-decoder low-voltage power source control unit 33, the vertical row address Z1 and the erase operation control signal ER become high and the control signal NEN becomes the ground voltage. As for the sub-decoder low-voltage power source switch 25, since the negative voltage RNEGP and the control signal NEN are the ground voltage, the sub-decoder low-voltage XDS becomes the ground voltage. As for the sub-decoder 23, the global word lines GWL and GWLB are the ground voltage, the sub-decoder high-voltage VWL is the ground voltage, and the local word line P2WL becomes a floating state. Since the access operation is not the programming operation in the main-decoder high-voltage power source control unit 43, the main-decoder high-voltage VPXH is the ground potential. As for the main decoder 45, the access operation is not the programming operation, the negative voltage RNEGP is the ground voltage, the global word line GWL is the ground voltage, and the erase operation control signal ER is high, so that the global word line GWLB becomes the ground voltage. In the sub-decoder high-voltage power source control unit 35, since the access operation is not the programming operation, the sub-decoder high-voltage VWL is the ground potential.

In the normal sector S17 to which the voltage bias is not applied, in regards to the word line negative voltage supplying unit 41, the horizontal row address Z2 becomes the ground voltage and the negative voltage RNEGP becomes the ground voltage. As for the well potential control unit 31, both of the vertical row address Z1 and the erase operation control signal ER become high and the well potential VNW becomes 9V. As for the sub-decoder low-voltage power source control unit 33, the vertical row address Z1 and the erase operation control signal ER become high, and the control signal NEN becomes the ground voltage. As for the sub-decoder low-voltage power source switch 25, the negative voltage RNEGP and the control signal NEN are the ground voltage, so that the sub-decoder low voltage XDS becomes the ground voltage. As for the sub decoder 23, the global word lines GWL and GWLB are the ground voltages, the sub-decoder high voltage VWL is the ground voltage, and the local word line P2WL becomes a floating state. Since the access operation is not the programming operation in the main-decoder high-voltage power source control unit 43, the main-decoder high-voltage VPXH is the ground potential. As for the main decoder 45, the access operation is not the programming operation, the negative voltage RNEGP is the ground voltage, the global word line GWL is the ground voltage, and the erase operation control signal ER is high, so that the global word line GWLB becomes the ground voltage in the sub-decoder high-voltage power source control unit 35, since the access operation is not the programming operation, the sub-decoder high-voltage VWL is the ground potential.

In step 2 of the erase (ER) access operation, with respect to horizontal rows, a voltage bias is applied only to the horizontal row Z2(7) including the defective sector S07. With respect to vertical rows, the voltage bias is not applied only to the vertical row Z1(0).

A voltage bias is not applied to the normal sector S06. As for the word line negative voltage supplying unit 41, the horizontal row address Z2 is set to the ground voltage and the negative voltage RNEGP becomes the ground voltage. As for the well potential control unit 31, the vertical row address Z1 is set to the ground voltage, and the well potential VNW becomes the ground voltage. As for the sub-decoder low-voltage power source control unit 33, the vertical tow address Z1 is set to the ground voltage, and the control signal NEN become −9V. As for the sub-decoder low-voltage power source switch 25, the negative voltage RNEGP becomes the ground voltage, and the control signal NEN becomes −9V, so that the sub-decoder low voltage XDS becomes the ground voltage. As for the sub decoder 23, the global word lines GWL and GWLB are set to the ground voltage, the sub-decoder high voltage VWL becomes the ground voltage, and the local word line P2WL enters a floating state. In the main-decoder high-voltage power source control unit 43, since the access operation is not the programming operation, the main-decoder high-voltage VPXH is the ground potential. As for the main decoder 45, the access operation is not the programming operation, the negative voltage RNEGP is the ground voltage, the global word line GWL also becomes the ground voltage, and the erase operation control signal ER is high, so that the global word line GWLB becomes the ground voltage. In the sub-decoder high-voltage power source control unit 35, since the access operation is not the programming operation, the sub-decoder high-voltage VWL is the ground potential.

A voltage bias is not applied to the defective sector S07. As for the word line negative voltage supplying unit 41, the horizontal row address Z2 and the erase operation control signal ER are set to high, and the negative voltage RNEGP becomes −9V. As for the well potential control unit 31, the vertical row address Z1 becomes the ground voltage, and the well potential VNW becomes the ground voltage. As for the sub-decoder low-voltage power source control unit 33, the vertical row address Z1 becomes the ground voltage, and the control signal NEN becomes −9V. As for the sub-decoder low-voltage power source switch 25, the negative voltage RNEGP becomes −9V; the control signal NEN becomes −9V, and the sub-decoder low-voltage XDS becomes the ground voltage. As for the sub-decoder 23, the global word line GWL becomes −9V, the global word line GWLB becomes the ground voltage, the sub-decoder high-voltage VWL is the ground voltage, and the local word line P2WL becomes a floating state. Since the access operation is not the programming operation in the main-decoder high-voltage power source control unit 43, the main-decoder high-voltage VPXH is the ground potential. As for the main decoder 45, the negative voltage RNEGP and the global word line GWL become −9V, and the erase operation control signal ER is high, so that the global word line GWLB becomes the ground voltage. In the sub-decoder high-voltage control unit 35, since the access operation is not the programming operation, the sub-decoder high-voltage VWL is the ground potential.

The voltage bias is applied to the normal sector S17. As for the word-line negative-voltage supplying unit 41, the horizontal row address Z2 and the erase operation control signal ER are set to high, and the negative voltage RNEGP becomes −9V. As for the well potential control unit 31, both of the vertical row address Z1 and the erase operation control signal ER become high and the well potential VNW becomes 9V. As for the sub-decoder low-voltage power source control unit 33, the vertical row address Z1 and the erase operation control signal ER become high, and the control signal NEN becomes the ground voltage. As for the sub-decoder low-voltage power source switch 25, the negative voltage RNEGP becomes −9V and the control signal NEN becomes the ground voltage, so that the sub-decoder low voltage XDS becomes −9V. As for the sub decoder 23, the global word line GWL becomes −9V, the global word line GWLB becomes the ground voltage, the sub-decoder high voltage VWL is the ground voltage, and the local word line P2WL becomes −9V. Since the access operation is not the programming operation for the main-decoder high-voltage control unit 43, the main-decoder high-voltage VPXH is the ground potential. As for the main decoder 45, the negative voltage RNEGP becomes −9V, the global word line GWL becomes −9V, and the erase operation control signal ER is high, so that the global word line GWLB becomes the ground voltage. In the sub-decoder high-voltage power source control unit 35, since the access operation is not the programming operation, the sub-decoder high-voltage VWL is the ground potential.

A batch access operation for erasing all of the sectors together (for example, a batch erase operation) which is not shown in FIG. 20 is performed in two steps in a manner similar to the erase (ER) stress operation. The ER stress (of the first and second times) is applied as follows. An external voltage (+9V) of the storage device is applied to a well WELL and a self generation voltage (−9V) of the storage device is applied to the local word line P2WL, thereby applying stress between WELL and P2WL. At the time of the batch erase operation (for the first time), the self generation voltage (+9V/−9V) is used as the voltage applied to WELL and the voltage applied to P2WL.

Next, the programming (PGM) access operation will be described. In step 1, the voltage bias is not applied to the horizontal row Z2(7) including the defective sector S07. "0"V is indicated in the boxes of Z2 in the sectors S07 and S17.

With respect to the normal sector S06 to which the voltage bias is applied, for the word line negative voltage supplying unit 41, since the access operation is not the erase (ER) operation, the ground voltage is supplied as the negative voltage RNEGP. As for the well potential control unit 31, since the access operation is not the erase (ER) operation, the ground voltage is set as the well potential VNW. As for the sub-decoder low-voltage power source control unit 33, since the access operation is not the erase (ER) operation, the control signal NEN is set high. As for the sub-decoder low-voltage power source switch 25, the negative voltage RNEGP is set to the ground voltage and the control signal NEN is set high, so that the sub-decoder low voltage XDS is set to the ground voltage. As for the sub decoder 23, the global word line GWL is set to 9V, the global word line GWLB is set to the ground voltage, the sub-decoder high voltage VWL is set to 9V, and the local word line P2WL is set to 9V. In the main-decoder high-voltage power source control unit 43, the horizontal row address Z2 and the programming operation control signal PGM are set to high, and the main-decoder high-voltage VPXH is set to 9V. As for the main decoder 45, the horizontal row address Z2, programming operation control signal PGM, and address signal ADD are set to high, the global word line GWL is set to 9V, and the global word line GWLB is set to the ground voltage. In the sub-decoder high-voltage power source control unit 35, the vertical row address Z1, programming operation control signal PGM, and address signal ADD are set high, and the sub-decoder high-voltage VWL is set to 9V.

A voltage bias is not applied to the defective sector S07. As for the word line negative voltage supplying unit 41, since the access operation is not the erase (ER) operation, the negative voltage RNEGP is set to the ground voltage. As for the well potential control unit 31, since the access operation is not the erase (ER) operation, the well potential VNW becomes the ground voltage. As for the sub-decoder low-voltage power source control unit 33, since the access operation is not the erase (ER) operation, the control signal NEN becomes high. As for the sub-decoder low-voltage power source switch 25, since the negative voltage RNEGP is set to the ground voltage, the control signal NEN is set high, and the sub-decoder low-voltage XDS is set to the ground voltage. As for the sub-decoder 23, the global word line GWL is set to the ground voltage, the global word line GWLB is set high, the sub-decoder high-voltage power VWL is 9V, and the local word line P2WL is set to the ground voltage. In the main-decoder high-voltage power source control unit 43, the horizontal row address Z2 is set to the ground voltage, and the main-decoder high-voltage VPXH is set to the ground potential. As for the main decoder 45, the horizontal row address Z2 is set to the ground voltage, the global word line GWL is set to the ground voltage, and the global word line GWLB becomes high. In the sub-decoder high-voltage power source control unit 35, the vertical row address Z1, programming operation control signal PGM, and address signal ADD are set high, and the sub-decoder high-voltage VWL is set to 9V.

In the normal sector S17 to which the voltage bias is not applied, for the word line negative voltage supplying unit 41, since the access operation is not the erase (ER) operation, the negative voltage RNEGP is set to the ground voltage. As for the well potential control unit 31, since the access operation is not the erase (ER) operation, the well potential VNW is set to the ground voltage. As for the sub-decoder low-voltage power source control unit 33, since the access operation is not the erase (ER) operation, the control signal NEN is set high. As for the sub-decoder low-voltage power source switch 25, the negative voltage RNEGP is set to the ground voltage, the control signal NEN is set high, and the sub-decoder low voltage XDS is set to the ground voltage. As for the sub decoder 23, the global word line GWL is set to the ground voltage, the global word line GWLB is set high, the sub-decoder high voltage VWL is set to 9V, and the local word line P2WL is set to the ground voltage. In the main-decoder high-voltage power source control unit 43, the vertical row address Z2 becomes the ground voltage, and the main-decoder high-voltage VPXH is the ground potential. As for the main decoder 45, the horizontal row address Z2 is set to the ground voltage, the global word line GWL is set to the ground voltage, and the global word line GWLB becomes high. In the sub-decoder high-voltage power source control unit 35, the vertical row address Z1, programming operation control signal PGM, and address signal ADD become high, and the sub-decoder high-voltage VWL becomes 9V.

In step 2 in the program (PGM) access operation, with respect to horizontal rows, a voltage bias is applied only to the horizontal row Z2(7) including the defective sector S07. With respect to vertical rows, the voltage bias is not applied only to the vertical row Z1(0).

A voltage bias is not applied to the normal sector S06. As for the word line negative voltage supplying unit 41, since the access operation is not the erase (ER) operation, the negative voltage RNEGP becomes the ground voltage. As for the well potential control unit 31, since the access operation is not the erase (ER) operation, the well potential VNW is set to the ground voltage. As for the sub-decoder low-voltage power source control unit 33, since the access operation is not the erase (ER) operation, the control signal NEN is set high. As for the sub-decoder low-voltage power source switch 25, the negative voltage RNEGP is set to the ground voltage, the control signal NEN is set to high, and the sub-decoder low voltage XDS is set to the ground voltage. As for the sub decoder 23, the global word line GWL is set to the ground voltage, the global word line GWLB is set to high, the sub-decoder high voltage VWL is set to the ground voltage, and the local word line P2WL is set to the ground voltage. In the main-decoder high-voltage power source control unit 43, the horizontal row address Z2 is set to the ground voltage, and the main-decoder high-voltage VPXH is set to the ground potential. As: for the main decoder 45, the horizontal row address Z2 is set to the ground voltage, the negative voltage RNEGP is set to the ground voltage, the global word line GWL is also set to the ground voltage, and the global word line GWLB is set high. In the sub-decoder high-voltage control unit 35, the vertical row address Z1 is set to the ground voltage, the programming operation control signal PGM and the address signal ADD are set high, and the sub-decoder high-voltage VWL is set to 9V.

A voltage bias is not applied to the defective sector S07. As for the word line negative voltage supplying unit 41, since the access operation is not the erase (ER) operation, the negative voltage RNEGP is set to the ground voltage. As for the well potential control unit 31, since the access operation is not the erase (ER) operation, the well potential VNW is set to the ground voltage. As for the sub-decoder low-voltage power source control unit 33, since the access operation is not the erase (ER) operation, the control signal NEN is set to high. As for the sub-decoder low-voltage power source switch 25, the negative voltage RNEGP is set to the ground voltage, the control signal NEN is set to high, and the sub-decoder low-voltage XDS is set to the ground voltage. As for the sub-decoder 23, the global word line GWL is set to 9V, the global word line GWLB is set to the ground voltage, the sub-decoder high-voltage VWL is set to the ground voltage, and the local word line P2WL is set to the ground voltage. In the main-decoder high-voltage power source control unit 43, the horizontal row address Z2 and the program operation control signal PGM are set high, and the main-decoder high-voltage VPXH is set to 9V. As for the main decoder 45, the horizontal row address Z2, the programming operation control signal PGM, and the address signal ADD become high, the global word line GWL is set to 9V, and the global word line GWLB is set to the ground voltage. In the sub-decoder high-voltage power source control unit 35, the vertical row address Z1 is set to the ground voltage, and the sub-decoder high-voltage VWL is set to the ground potential.

To the normal sector S17, the voltage bias is applied. As for the word line negative voltage supplying unit 41, since the access operation is not the erase (ER) operation, the negative voltage RNEGP is set to the ground voltage. As for the well potential control unit 31, since the access operation is not the erase (ER) operation, the well potential VNW is set to the ground voltage. As for the sub-decoder low-voltage power source control unit 33, since the access operation is not the erase (ER) operation, the control signal NEN is set high. As for the sub-decoder low-voltage power source switch 25, the negative voltage RNEGP is set to the ground voltage and the control signal NEN is set high, so that the sub-decoder low voltage XDS is set to the ground voltage. As for the sub decoder 23, the global word line GWL is set to 9V, the global word line GWLB is set to the ground voltage, the sub-decoder high voltage VWL is set to 9V, and the local word line P2WL is set to 9V. In the main-decoder high-voltage power source control unit 43, the horizontal row address Z2 and the program operation control signal PGM are set high, and the main-decoder high-voltage VPXH is set to 9V. As for the main decoder 45, the horizontal row address Z2, the program operation control signal PGM, and the address signal ADD are set high, the global word line GWL is set to 9V, and the global word line GWLB is set to the ground voltage. In the sub-decoder high-voltage power source control unit 35, the vertical row address Z1, programming operation control signal PGM, and address signal ADD are set high, and the sub-decoder high-voltage VWL is set to 9V.

In FIG. 21, in a leak current test (HTRB leak) by a stress test, the voltage bias is applied in a manner similar to the case of the programming access operation. In this case, in place of 9V as the high voltage, a voltage is supplied from an external terminal (for example, a pad) which will be described later in regards to FIG. 22. When the voltage applied to the external terminal is about 6V, the presence/absence of a new leak current after the voltage stress can be detected.

The first chip erase (ER) will now be described. In this case, the vertical row Z1(0) is an object to be erased, so that the erase access operation is completed in one step. While no voltage bias is applied to the horizontal row Z2(7) including the defective sector S07, a voltage bias is applied to the vertical row Z1(0).

With respect to the normal sector S06 to which the voltage bias is applied by the word line negative voltage supplying unit 41, the horizontal row address signal Z2 and the erase operation control signal ER are set high, and the negative voltage RNEGP is set to −9V. As for the well potential control unit 31, the vertical row address Z1 and the erase operation control signal ER are set high, and the well potential VNW is set to 9V. As for the sub-decoder low-voltage power source control unit 33, the vertical row address Z1 and the erase operation control signal ER are set high and the control signal NEN is set to the ground voltage. As for the sub-decoder low-voltage power source switch 25, the negative voltage RNEGP is set to −9V and the control signal NEN is set to the ground voltage, so that the sub-decoder low voltage XDS becomes −9V. As for the sub decoder 23, the global word line GWL is set to −9V, the global word line GWLB is set to the ground voltage, the sub-decoder high voltage VWL is set to the ground voltage, and the local word line P2WL is set to −9V. In the main-decoder high-voltage power source control unit 43, since the access operation is not the programming (PGM) operation, the main-decoder high-voltage VPXH is the ground potential. As for the main decoder 45, since the access operation is not the programming (PGM) operation, the erase operation control signal ER is set high, and both of the global word lines GWL and GWLB are set to the ground voltage. In the sub-decoder high-voltage control unit 35, since the access operation is not the programming (PGM) operation, the sub-decoder high-voltage VWL is the ground potential.

A voltage bias is not applied to the defective sector S07. As for the word line negative voltage supplying unit 41, the horizontal row address Z2 is set to the ground voltage, and the negative voltage RNEGP becomes the ground voltage. As for the well potential control unit 31, the vertical row address Z1 and the erase operation control signal ER are set high, and the well potential VNW becomes 9V. As for the sub-decoder low-voltage power source control unit 33, the vertical row address Z1 and the erase operation control signal ER are set high and the control signal NEN becomes the ground voltage. As for the sub-decoder low-voltage power source switch 25, the negative voltage RNEGP and the control signal NEN are set to the ground voltage, the sub-decoder low-voltage XDS is set to the ground voltage. As for the sub-decoder 23, the global word lines GWL and GWLB are set to the ground voltage, the sub-decoder high-voltage VWL is set to the ground voltage, and the local word line P2WL becomes a floating state. In the main-decoder high-voltage power source control unit 43, since the access operation is not the programming (PGM) operation, the main-decoder high-voltage VPXH is the ground potential. As for the main decoder 45, since the access operation is not the programming (PGM) operation, the erase operation control signal ER is set high and the global word lines GWL and GWLB are set to the ground voltage. In the sub-decoder high-voltage power source control unit 35, since the access operation is not the programming (PGM) operation, the sub-decoder high-voltage VWL is set to the ground potential.

In the normal sector S17 to which the voltage bias is not applied, by the word line negative voltage supplying unit 41, the horizontal row address Z2 is set to the ground voltage and the negative voltage RNEGP is set to the ground voltage. As for the well potential control unit 31, both of the vertical row address Z1 and the well potential VNW are set to the ground voltage. As for the sub-decoder low-voltage power source control unit 33, the vertical row address Z1 is set to the ground voltage, and the control signal NEN is set to −9V. As for the sub-decoder low-voltage power source switch 25, the negative voltage RNEGP is set to the ground voltage, the control signal NEN is set to −9V, and the sub-decoder low voltage XDS is set to the ground voltage. As for the sub decoder 23, the global word lines GWL and GWLB and the sub-decoder high voltage VWL are set to the ground voltage, and the local word line P2WL is set to a floating state. In the main-decoder high-voltage power source control unit 43, since the access operation is not the programming (PGM) operation, the main-decoder high-voltage VPXH is the ground potential. As for the main decoder 45, since the access operation is not the programming (PGM) operation, the erase operation control signal ER is high, and the global word lines GWL and GWLB are set to the ground voltage. In the sub-decoder high-voltage power source control unit 35, since the access operation is not the programming (PGM) operation, the sub-decoder high voltage VWL is set to the ground voltage.

Figure 22:
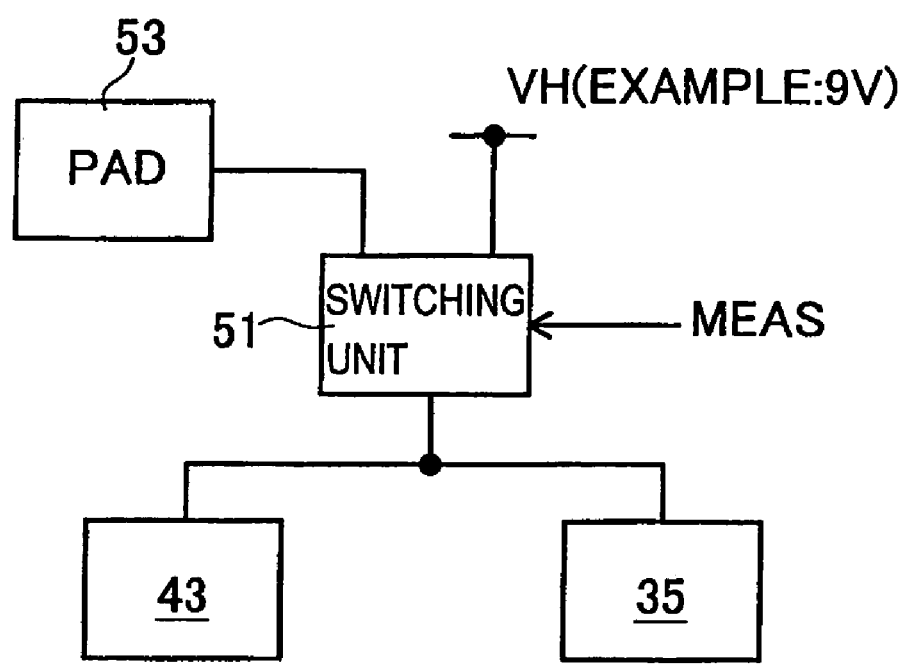
FIG. 22 shows circuit blocks including a power switching unit in accordance with the present invention.

FIG. 22 shows an example of the configuration of a circuit for switching the high voltage between a high voltage VH (for example, 9V) supplied internally and a voltage supplied externally via a pad 53 as an external terminal. The configuration is employed at the time of conducting a so-called HTRB leak test for detecting a leak current which accompanies the occurrence of a new crystal defect or the like due to a stress test of applying high voltage. Usually, by supplying a power via the pad 53 in place of the high voltage internally supplied, the presence or absence of a leak current after application of the voltage bias can be detected.

In FIG. 22, the high voltage to be supplied to the sub-decoder high-voltage power source control unit 35 and the main-decoder high-voltage power source control unit 43 is switched between a high voltage VH internally supplied and the voltage supplied via the pad 53 by a switching unit 51. At the time of a stress test, a test signal MEAS controls the switching unit 51 to connect the high voltage from the pad 53 to the sub-decoder high-voltage power source control unit 35 and the main-decoder high-voltage power source control unit 43. The sub-decoder high-voltage power source control unit 35 and the main-decoder high-voltage power source control unit 43 receive the high voltage and output a sub-decoder high voltage VWL and a main-decoder high voltage VPXH, respectively. The sub-decoder high voltage VWL and main-decoder high voltage VPXH become high voltages in the sub decoder 23 and the main decoder 45, respectively, and the high voltage is supplied to the local word line P2WL and the global word line GWL. By detecting a leak current, the presence or absence of a leak current in the local word line P2WL and the global word line GWL can be detected.

As is obvious from the above description, according to the embodiment, in the memory cell array ARY constructed by a plurality of sectors S00 to S37 as an example of a memory block, it is sufficient to provide vertical row voltage control units (C1(0) to C1(3)) and horizontal row voltage control units (C2(0) to C2(7)) as an example of first and second voltage control sections in vertical rows and horizontal rows of the sectors. It is unnecessary to provide a voltage control unit for each sector. It is sufficient to dispose the vertical row voltage control units (C1(0) to C1(3)) and horizontal row voltage control units (C2(0) to C2(7)) in the peripheral portion of the memory cell array ARRY, and the memory cells can be concentratedly disposed in the memory array ARY. With a configuration different from the device configuration for a control circuit as a component of the voltage control unit and a design rule, the memory cell array ARY can be designed efficiently. Also in the case where the number of sectors increases, the number of voltage control units required can be reduced. Therefore, an increase in the chip area can be controlled.

At the time of applying a voltage bias simultaneously to a plurality of sectors by controlling application of the voltage bias to each of the horizontal rows and vertical rows, to control the voltage bias not to be applied to either the vertical row or horizontal row of a defective sector, no voltage bias can be applied. A voltage bias can be simultaneously applied to sectors in a sector group other than a defective sector and sectors existing in a vertical row/ horizontal row which includes the defective sector and on which control for not applying a voltage bias is performed.

The invention can prevent a drop in the stress voltage caused by leakage in a defective memory block.

Further, by performing an access operation on each of the good memory blocks only once, application of excessive stress by performing the access operation twice, abnormality in the threshold of a memory cell caused by over-erasure, over-programming, or the like, and the increase in test time by the access operation can be prevented.

Further, by controlling application of a bias to each of rows in the first and second directions while avoiding application of a bias to a defective memory block, a leak by the defective memory block does not occur at the time of a leak test. Thus, a leak of a plurality of good memory blocks can be truly measured.

Moreover, in a batch access operation (for example, batch erase operation) on all of the sectors and an access operation (for example, first chip erase) on a partially selected sector group, even if there is a defective sector in the sectors to be accessed, a process can be performed with a minimum number of steps. Thus, shortened erase time can be provided to the users.

Obviously, the invention is not limited to the foregoing embodiments but can be variously improved and modified without departing from the gist of the invention.

For example, at the time of performing the batch access operation in FIGS. 2 and 3, the case where one defective sector exists has been described. However, the invention is not limited to this case. In the case where a plurality of defective sectors exist in the same vertical row or horizontal row, the batch access operation of two steps described with reference to FIG. 2 can be performed. Also in the case where a plurality of sectors do not exist in the same vertical row or horizontal row, a method of sequentially applying a voltage bias on the vertical row or horizontal row unit basis like the method shown in FIG. 1 can be used.

In the foregoing embodiment, in step 1, all of the vertical rows are selected, a voltage bias is applied to the vertical rows but a voltage bias is not applied to a row in which a defective sector exists and, in step 2, a voltage bias is applied to the normal sectors to which the voltage bias has not been applied. The invention is not limited to the embodiment. In steps 1 and 2, the vertical rows and horizontal rows subjected to the application control may be reversed.

The positive voltage logic and the negative voltage logic of internal signals and output signals of the internal address output control unit, the vertical row address decoder, the horizontal row address decoder, and the other circuits may also be reversed.

The well denotes the node just below the channel of a nonvolatile memory cell and is not limited to any process structures.

What is claimed is:

1. A storage device comprising a plurality of memory blocks, wherein the memory blocks are fundamental units to be accessed and disposed in at least one of a first direction and a second direction, the first direction and the second direction intersecting with each other, the storage device comprising:
    a first voltage control section coupled to respective first rows aligned along the first direction to control an application of bias voltage to the respective first rows; and
    a second voltage control section coupled to respective second rows aligned along the second direction to control an application of bias voltage to the respective second rows,
    wherein at least two of the plurality of memory blocks, excluding any defective memory blocks, which are disposed at a cross section between the respective first rows and the respective second rows are simultaneously accessed.

2. A storage device according to claim 1, further comprising a defective memory block position advising section to advise location information on certain rows lined along at least one of the first and second directions, the location information showing where the defective memory blocks among the plurality of memory blocks are situated,
    wherein one of the first voltage control section and the second voltage control section coupled to the certain rows corresponding to the location information controls the bias voltage such that the bias voltage is not applied to the certain rows.

3. A storage device according to claim 2, wherein a first signal containing the location information for certain first rows lined along the first direction is input to the first voltage control section, and a second signal containing the location information on certain second rows aligned along the second direction is input to the second voltage control section.

4. A storage device according to claim 2,
    wherein when the plurality of memory blocks are disposed to the first and second directions respectively, the bias voltage is applied by all of the first voltage control sections to all of the first rows aligned along the first direction according to a first step signal and the bias voltage is not applied to the certain rows corresponding to the location information while being applied by the second voltage control section to rows among the respective second rows aligned along the second direction other than the certain rows corresponding to the location information,
    wherein according to a second step signal, the bias voltage is not applied to the certain rows corresponding to the location information while being applied by the first voltage control section to rows among the respective first rows aligned along the first direction other than the certain rows corresponding to the location information and the bias voltage is applied to the certain rows corresponding to the location information while not being applied by the second voltage control section to rows among the respective second rows aligned along the second direction other than the certain rows corresponding to the location information.

5. A storage device according to claim 4 further comprising a row decoder to decode an address signal to discriminate between the respective first rows aligned along the first direction and the respective second rows aligned along the second direction,
    wherein the row decoder is provided with an alternative selection decoding section to select any one row among the first and second rows in response to the address signal and a selection inversion section to unselect the row selected by the alternative selection decoding section while selecting all of the other rows according to one or both of the first step signal and the second step signal.

6. A storage device according to claim 5,
    wherein one of the first and second step signals, a row selection signal output by the row decoder and the location information on the certain rows aligned along one of the first and second directions are input to the first and second voltage control sections, and
    wherein a row not corresponding to the location information, but corresponding to the row selection signal is selected according to one of the first and second step signals.

7. A storage device according to claim 6 further comprising a word line and a well,
    wherein the respective memory blocks are composed of a non-volatile memory cell and
    wherein when access is intended for performing an erasing operation, the first and second voltage control sections apply the bias voltage to the word line and the well.

8. A storage device according to claim 6 further comprising a word line,
    wherein the respective memory blocks are composed of a non volatile memory cell, and
    wherein when access is intended for performing a programming operation, the first and second voltage control sections apply the bias voltage to the word line.

9. A storage device according to claim 8 further comprising a high-order power source line and a sub-decoder coupled to the high-order power source line,
    wherein the word line includes a local word line that is connected to the respective memory cells and disposed within the respective memory blocks, and a global word line whose wiring goes beyond the respective memory blocks, and
    wherein the sub-decoder is provided to control application of high-order power to the local word line according to a combination of the global word line and the high-order power source line, and
    wherein the first voltage control section applies the bias voltage to the global word line while the second voltage control section applies the bias voltage to the high-order power source line.

10. A storage device according to claim 1 further comprising a switchover section,
    wherein access to the respective memory blocks is intended for one of a stress application test and a leak test to be performed on the respective memory blocks, and
    wherein the switchover section is provided to switch over an application path of the bias voltage to an external terminal upon performing one of the stress application test and leak test on the respective memory blocks.

11. A storage device according to claim 1, wherein the respective memory blocks are composed of a non-volatile memory cell.

12. A storage device according to claim 11, wherein access is intended for performing at least one of an erasing operation, a programming operation, a stress application test and a leak test operation.

13. A bias voltage application method for a storage device provided with a plurality of memory blocks that are fundamental units to be accessed and disposed to least one of a first direction and a second direction intersecting with each other for disposition, the method comprising the steps of:

applying bias voltage to the plurality of memory blocks by controlling an application of the bias voltage to respective first rows aligned along the first direction and respective second rows aligned along the second direction; and when defective memory blocks exist among the plurality of memory blocks, not applying the bias voltage to certain rows corresponding to certain locations where the defective memory blocks exist among the respective rows aligned along one of the first and second directions.

14. A bias voltage application method for a storage device according to claim 13, wherein when the plurality of memory blocks are disposed to the first and second directions respectively, controlling all of the first rows aligned along the first direction such that the bias voltage is applied to all of the first rows and controlling the respective second rows aligned along the second direction such that the bias voltage is not applied to certain rows where defective memory blocks exist while being applied to the other rows among the second rows; and controlling the respective first rows lined along the first direction such that the bias voltage is not applied to certain rows where the defective memory blocks exist while being applied to the other rows among the first rows and controlling the respective second rows aligned along the second direction such that the bias voltage is applied to certain rows where the defective memory blocks exist while not being applied to the other rows among the second rows.

15. A bias voltage application method for a storage device according to claim 13, wherein a pair of complementary address signals, one of which signals is defined as an active logical level according to a logical level of a bit signal, are provided to respective bits of an address signal to discriminate between the first rows aligned along the first direction and the second rows aligned along the second direction, and wherein the pair of complementary address signals for any of the address signals that does not correspond to certain locations where the defective memory blocks exist are jointly defined as an inactive logical level, while one of the pair of complementary address signals for all of the address signals that correspond to the certain locations is defined as the active logical level.

16. A bias voltage application method for a storage device according to claim 13, wherein when access to the respective memory blocks is intended for performing one of a stress application test and a leak test on the blocks, the bias voltage is applied from outside the storage device.

* * * * *